United States Patent [19]
Hamamoto

[11] Patent Number: 5,811,890
[45] Date of Patent: Sep. 22, 1998

[54] BATTERY OPERATED INFORMATION PROCESSING APPARATUS

[75] Inventor: Akihiko Hamamoto, Kawasaki, Japan

[73] Assignee: Canon Kabushiki Kaisha, Tokyo, Japan

[21] Appl. No.: 547,808

[22] Filed: Oct. 25, 1995

[51] Int. Cl.⁶ .................................................. G06F 7/02
[52] U.S. Cl. ............................ 307/66; 361/92; 364/707
[58] Field of Search ............................. 307/66; 364/707; 395/750; 361/92

[56] References Cited

U.S. PATENT DOCUMENTS 5,175,845  12/1992  Little ......................................... 364/707
5,515,303   5/1996  Cargin, Jr. et al. ................. 364/708.11

Primary Examiner—Howard L. Williams
Attorney, Agent, or Firm—Fitzpatrick, Cella, Harper & Scinto

[57] ABSTRACT

Disclosed is a portable information processing apparatus that can detect a remaining battery charge level quickly and comparatively accurately while it eliminates the influence of noise that can be caused when a remaining battery charge is to be detected, that can prevent a battery pack from being mistakenly identified as abnormal by delaying the timing for detecting the unbalanced state of the voltages at each voltage row, which can occur temporarily during the charging of a secondary battery pack when a plurality of cells are connected in series and parallel, that changes power control procedures for each different suspend mode so that it can control with no problem the supply of power to a unit, such as a printer unit, that consumes a large current, even when a remaining battery charge is comparatively low and that can match the phases of the individual units to ensure rebooting is actually performed when a power supply SW is turned on or off at an arbitrary time.

24 Claims, 19 Drawing Sheets

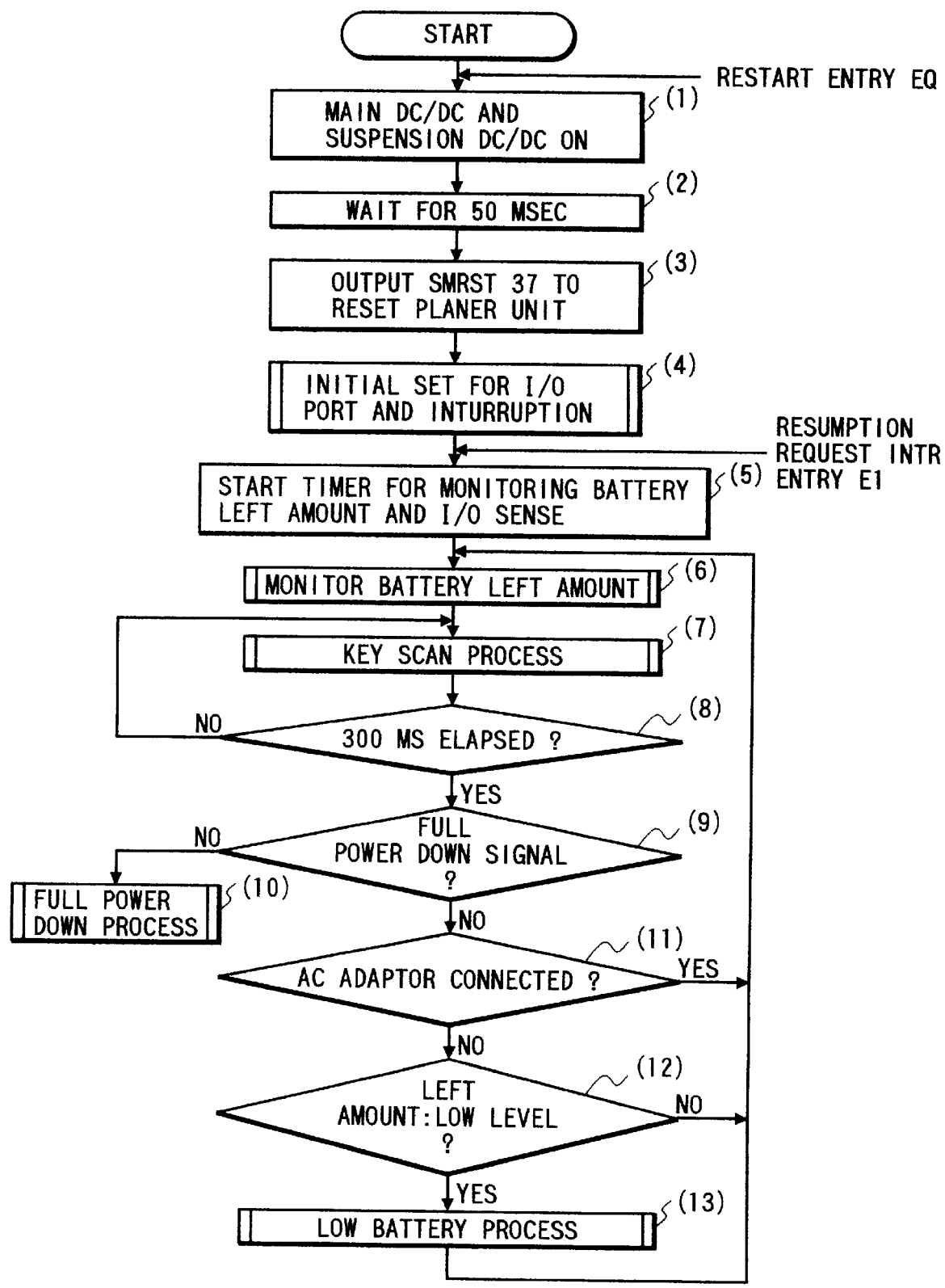

FIG. 14

| POWER LED | < 250 MA | 250 MA TO 750 MA | 750 MA TO 1250 MA | 1250 MA TO 1750 MA | 1750 MA TO 2250 MA | 2250 MA TO 2750 MA | 2750 MA TO 3250 MA | > 3250 MA |
|---|---|---|---|---|---|---|---|---|
| GREEN | 11.71 | 11.65 | 11.55 | 11.44 | 11.29 | 11.13 | 11.02 | 10.92 |
| YELLOW | 11.02 | 10.99 | 10.81 | 10.65 | 10.49 | 10.28 | 10.18 | 10.07 |
| ORANGE | 10.49 | 10.44 | 10.39 | 10.28 | 10.18 | 10.07 | 9.96 | 9.86 |
| ORANGE FLICKERING (LOW) | | | | | | | | |

DISCHARGE CURRENT LEVEL (8 LEVELS)

(UNIT: VOLT)

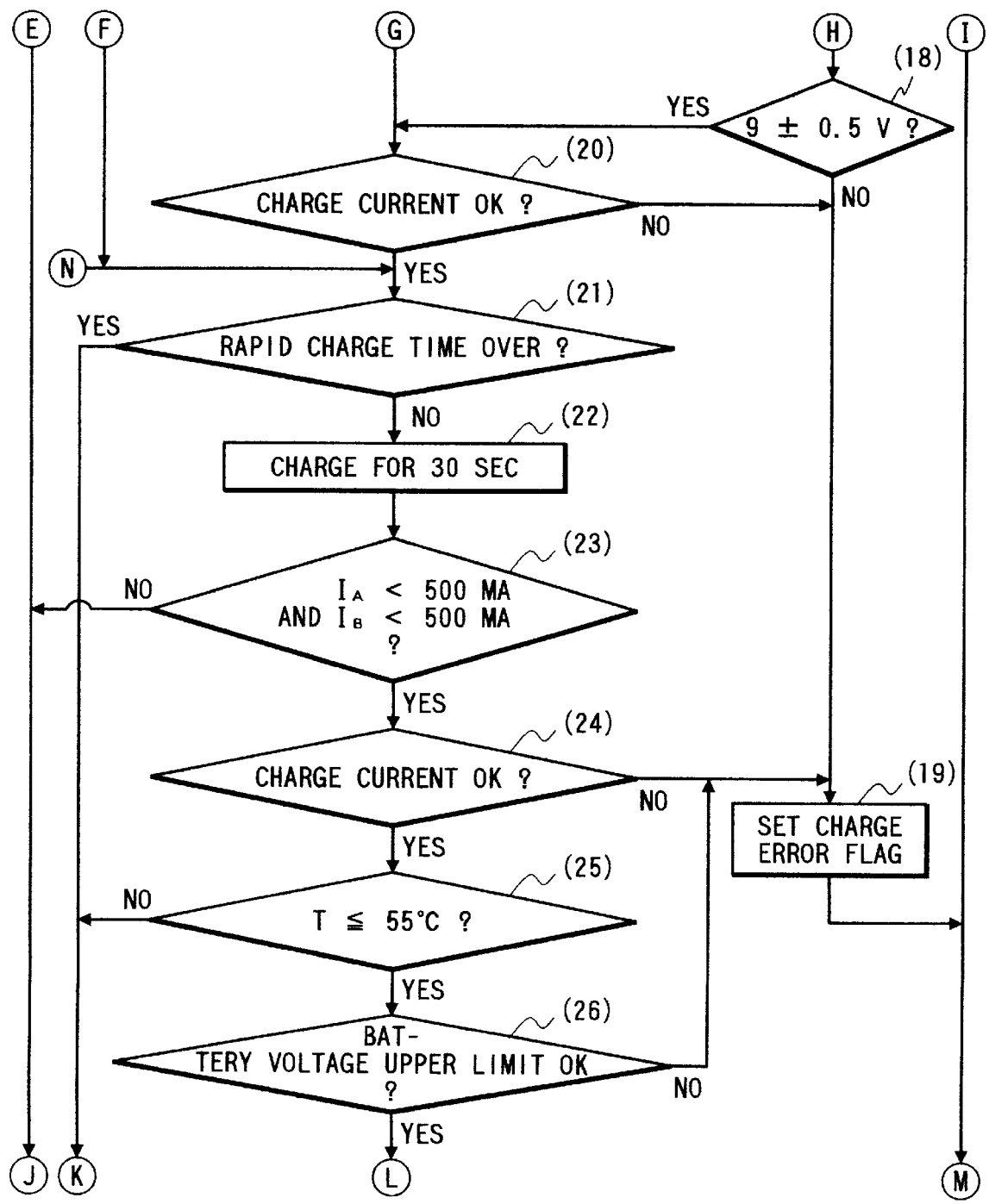

BATTERY OPERATED INFORMATION PROCESSING APPARATUS

BACKGROUND OF THE INVENTION

1. Field of the Invention

The present invention relates to a battery operated information processing apparatus; and in particular, to a portable information processing apparatus that includes means to detect the level of the charge remaining in a battery.

2. Related Background Art

Battery operation is indispensable for portable information processing apparatuses, and for this reason, methods by which to detect remaining battery charge levels are also required. Such methods vary, depending on the timing for the detection and the parameters that are employed, from the least expensive, according to which a comparator is used to detect a reduction in battery voltage and the detected value is then used to calculate a decrease in the remaining battery charge level, to a highly accurate method that calls for an installed, dedicated IC to perform integration of a discharge current. The following method, which is one that uses a general purpose one-chip microcomputer, is widely employed.

For each discharge current value, a remaining battery switching voltage and a remaining battery charge level are stored in advance in the form of a table. A discharge current is measured periodically, and by referring to a proximate value, a table that is to be used is selected. Then, the remaining battery switching voltage from the table that is selected is compared with the existing battery voltage and the change in the remaining battery charge level is obtained. In addition to providing a remaining battery charge detection function, a general purpose one-chip microcomputer supports a plurality of other functions (e.g., keyboard control, power control, and discharge control), thus enabling the construction of a portable information processing apparatus that is compact and that has a low power consumption.

A battery pack that is commonly used for portable information processing apparatuses has an internal arrangement in which five 1.2 V secondary cells, each of which has a capacity of 1000 to 2000 mAh, are connected in series. In operation, such a battery can provide a maximum discharge current of approximately 2 A, which is a momentary value that is required at the time an FD or an HD is accessed, but it normally provides one of around 1 A.

Whether or not a series battery pack is fully charged is determined from the reduction (a voltage drop (−ΔV)) in the battery voltage and the increase (an increased value or an increased rate) in the temperature within the battery pack. For the arrangement of a circuit in this case, various methods are employed that are in consonance with the price of and the specifications for an apparatus. In one such accurate method, a constant current power supply switching circuit, or a one-chip microcomputer, is employed in a portable information processing apparatus not only to detect a full charge, but also to provide management control for the charging time and error detection during the charging.

Ordinarily, as is shown in FIG. 18, a conventional portable information processing apparatus comprises a mother board that has a main, primary CPU 103; peripheral devices 104 and 105, such as a keyboard, an FD, an HD and a display; and a power supply unit 101.

In a thus arranged portable processing apparatus, when a power SW 100 is turned on, the power supply unit 101 begins to supply power. When a voltage reaches a predetermined value or higher, a reset IC 102 transmits a reset signal to the main CPU 103 and to CPUs in the individual devices, which are activated in turn and which are placed in an operational condition.

When the power SW 100 is turned off, the power supply unit 101 halts the supply of power and the CPUs and the electronic devices are deactivated. A period that continues from the time the power SW 100 is turned off until the power voltage falls to zero lasts several tens of msec at the maximum.

In the above prior art, however, deterioration of the accuracy with which the remaining battery charge is detected may result from the following factors.

First, when a table that is to be used is to be selected, a rounding error for approximating a discharge current can be the cause of a deterioration in the accuracy that is obtained during the detection of the remaining battery charge. Second, as a discharge current and a battery voltage are measured as AD conversion values for a corresponding input voltage, when noise caused by DC/DC transmission is carried on the input voltage, a conversion error can adversely affect the detection process for the remaining battery charge, and can thereby cause the accuracy to be deteriorated. Third, when the selection of a table and the comparison of voltages are being performed and a discharge current is greatly changed because an FD or an HD is accessed (i.e., when a load is changed during the detection of the remaining charge), the accuracy of the detection of the remaining charge is reduced.

To resolve the first problem, rounding errors can be decreased by increasing the kinds of discharge current samples that are available (by increasing the number of tables). For the second problem, a method has been proposed whereby AD conversion is performed a plurality of times (n times) and the average of the conversion results is employed to select a table. But since the number n is increased to acquire a more reliable average value, or since the time that is required for removing the maximum value and the minimum value is increased, when the third factor is involved the probability is high that the detection accuracy will be affected by a change in the load.

However, when the processing time that is required from the detection of a current to the detection of a voltage is shortened to reduce the influence of a change in the load, there is a large chance that errors will occur that are due to noise. Countermeasures that are taken for noise and countermeasures that are taken for load changes conflict with each other.

There are other methods that have been proposed: a method that provides for the remaining battery charge detection not to be performed periodically but only when the operating states of the FD, the HD, and other units are such that no load change will occur; and a method by which a consumed current for the operating units are determined in advance, and the sum of the discharge currents is calculated for the operating states of the individual units. With these methods, however, the cost of an apparatus is increased because a circuit for checking the operating states of the individual units is required.

Battery packs in which series connected secondary batteries are additionally arranged in parallel tend to be used in order to extend the operation period for an apparatus when it is driven by battery power. When a cell short circuit or a cell opening occurs on one side of such a battery pack in which batteries are arranged in parallel, there is a difference in voltage between the right and the left of the battery pack, and a charging current flows to and is concentrated on the side at which the voltage is lower. When charging is continued with a current having a value that is higher than a specific value, an abnormal generation of heat and the leaking of electrolyte from the battery will damage not only the battery pack but also the information processing apparatus.

It is desirable, therefore, that in addition to providing for the detection of a full charge, provision be made for the constant cyclic monitoring of the balance of a charging current.

A period that is required for fully charging a secondary battery that is fully discharged is normally about 90 minutes, and after setting up a charger and initiating the charging of a battery, a user tends to leave the charger and perform other work. It is, therefore, preferable that the first check on the balance of a charging current be performed within several seconds (about five seconds) following the initiation of charging.

In some cases, when the charging of a battery that has a very low remaining charge is begun immediately after (within 15 seconds) discharging is halted, the voltages at the right and the left sides of the battery pack may be unbalanced. When the balance of a charging current is checked several seconds after the charging has begun, therefore, the battery may be identified as an abnormal battery, even if it is actually a normal battery (a battery pack with no cell opening and no cell short circuit).

To prevent a normal battery from being identified as an abnormal battery, there is a method that provides for an increase in the voltage at which an apparatus is switched to a suspend state. With this method, however, not only is the battery operation period reduced, but also a memory effect tends to occur that reduces the apparent battery capacity.

When a peripheral device that must be retracted when the power is turned off is installed, a power supply unit for holding the power that is required for the period that continues until the retraction process is completed must be provided between a power SW 111 and a power supply unit 113, as is shown in FIG. 19.

In this example, a power control unit 112 detects the turning off of the power SW 111 and transmits a request to peripheral devices 115 through 117 for which the retraction process is required. Then, upon the receipt of an acknowledge signal (ACK), the power control unit 112 commands that the supply of power to the power supply unit 113 be halted. In the period that continues from the time the power SW 111 is turned off until the power supply unit 113 halts the supply of power and the power voltage drops to zero, a standby time (a power OFF delay) is generated in consonance with the retraction process of the peripheral devices.

An application program will sometimes cause an information processing apparatus to hang up, and although the apparatus should be reactivated by depressing a reset button, in many cases the reactivation is actually performed by turning the power SW 111 off and on within a short time of period. The time that a user needs to turn off and on the power SW 111 differs with the size of the power SW 111, but is about 100 msec at the shortest. For a common information processing apparatus, the maximum period that is required from the time the off state of the power SW is detected until the supply of power is halted is several tens of msec. Since, even taking the capacity of the apparatus into consideration, the power voltage falls to a voltage at which the resetting is performed or lower, no problems occur. In FIG. 19, a reset IC 118 transmits a reset signal to the devices 115 through 117.

When a device for which the retraction process is required, however, is incorporated in an information processing apparatus, an uncertain time delay is caused that is in consonance with the operating states of the units and that extends from the detection of the OFF state of the SW 111 until the halting of the DC/DC transmission. In this case, since at some times the power supply SW may be turned on again and the supply of power be begun before the power voltage falls to the reset occurrence voltage, as is shown in FIG. 11B, the reset IC 118 does not function and accordingly the apparatus is not reset.

SUMMARY OF THE INVENTION

To overcome the above shortcomings, it is one object of the present invention to provide a portable information processing apparatus that can detect a remaining battery charge level quickly and comparatively accurately while it eliminates the influence of noise that can be caused when a remaining battery charge is to be detected; that can prevent a battery pack from being mistakenly identified as abnormal by delaying the timing for detecting the unbalanced state of the voltages at each voltage row, which can occur temporarily during the charging of a secondary battery pack when a plurality of cells are connected in series and parallel; that changes power control procedures for each different suspend mode so that it can control with no problem the supply of power to a unit, such as a printer unit, that consumes a large current, even when a remaining battery charge is comparatively low; and that can match the phases of the individual units to ensure rebooting is actually performed when a power supply SW is turned on or off at an arbitrary time.

To achieve the above object, according to the present invention, a portable information processing apparatus, which processes data by employing power that is supplied from a battery, comprises:

an analog unit for monitoring a value of an analog current, which is discharged from the battery, via a resistor that is connected to the battery;

first conversion means for converting the value of the analog current that is monitored by the analog unit into a first digital current value at each specific cycle;

second conversion means for converting the first digital current value, which is acquired by conversion of the first conversion means, into a second digital current value, which is incremented or decremented by an allowable conversion value that is set in advance;

determination means for comparing the second digital current value, which is acquired by the second conversion means, with the first digital current value, which is acquired by the first conversion means, to determine whether or not a change in the first digital value and in the second digital value are convergent within an area of the allowable conversion value; and holding means for holding the first digital current value as a discharge current value of the battery when the determination means determines that the change in the first digital current value is convergent within an area of the allowable conversion value.

According to the present invention, a portable information processing apparatus comprises:

a table memory for storing a plurality of level tables that are employed for determining a battery remaining power level in consonance with a discharge current value of a secondary battery;

selection means for referring to the discharge current value held in holding means to temporarily select one of the level tables to determine the remaining battery power level of the secondary battery;

change determination means for, after the level table is selected by the selection means, determining whether or not the discharge current value of the secondary battery is convergent in a predetermined allowable change value range; and remaining battery power level determination means for, when the change determination means determines that the discharge current value of the secondary battery is convergent in the predetermined allowable change value range, comparing a voltage value of the secondary battery with a voltage value in the level table that is selected by the selection means to determine the remaining battery power level.

According to the present invention, a portable information processing apparatus, which processes data by employing power that is supplied from a battery pack wherein secondary batteries that are rechargeable by an AC adaptor are connected in parallel, comprises:

an analog unit for monitoring a value of an analog current, with which the secondary batteries are charged, via a resistor that is connected to the secondary batteries;

condition detection means for detecting condition data for the battery pack through the analog unit;

remaining battery charge determination means for employing the condition data detected by the condition detection means to determine a remaining battery charge of the battery pack;

charging control means for controlling the charging of the battery pack in consonance with the remaining battery charge that is determined by the remaining battery charge determination means; and error detection means for determining a current balance between the secondary batteries in the battery pack and detecting a charging error for each predetermined period of time that is consonant with the remaining battery charge following a charging start by the charging means.

According to the present invention, a portable information processing apparatus, which processes data by employing power that is supplied from a battery pack wherein secondary batteries rechargeable by an AC adaptor are connected in parallel, comprises:

power supply means for supplying a predetermined potential to units when a current flows from the battery pack, or for halting a supply;

instruction means for instructing the supply of a current and for halting the supply from the battery pack; and power source control means for detecting an instruction for halting the supply that is issued by the instruction means, and for controlling a time for halting of the supply of power from the power supply means to the units in consonance with an I/O monitoring state for a predetermined period.

BRIEF DESCRIPTION OF THE DRAWINGS

FIG. 6 is a flowchart showing a main example routine performed by a sub CPU in the portable information processing apparatus according to the present invention;

FIG. 14 is an example table showing discharge current levels and corresponding displays for a power LED in the portable information processing apparatus according to the present invention;

DETAILED DESCRIPTION OF THE PREFERRED EMBODIMENTS

Figure 1:
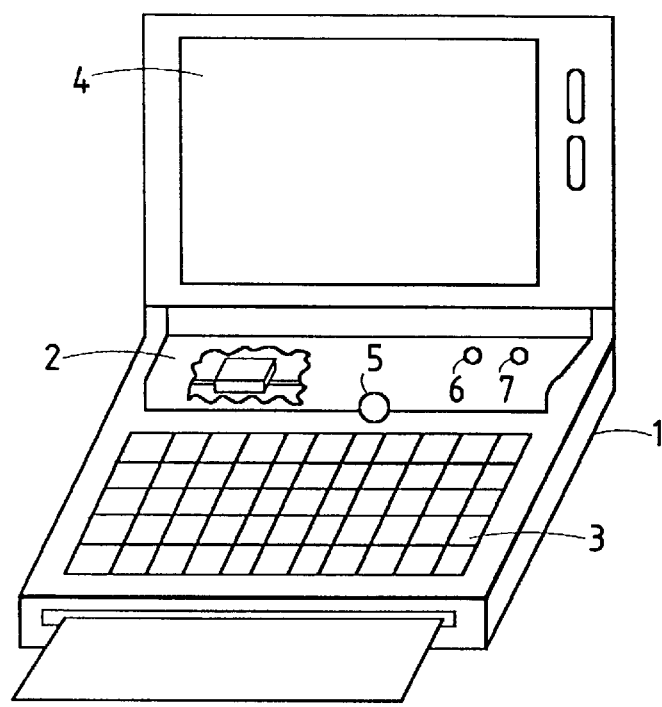
FIG. 1 is a diagram illustrating the external appearance of a portable information processing apparatus according to one embodiment of the present invention.

FIG. 1 is a diagram illustrating the external appearance of a portable information processing apparatus according to one embodiment of the present invention.

In FIG. 1, an ink jet printer 2 prints data that are processed by a body 1 of the portable information processing apparatus. Input keys (a keyboard) 3 are employed to enter data directly to the body 1 of the apparatus, and a liquid crystal display device 4 displays data.

A Resume/suspend switch (hereinafter, "SW" indicates "switch") 5 is used to switch to the normal state (resumption) in which the individual units can be operated and to the power saving state (suspension) in which the operation of the units are halted. A power LED 6 is employed mainly to display remaining battery capacity; and a charge LED 7 is employed to indicate that charging is being performed.

Figure 2:
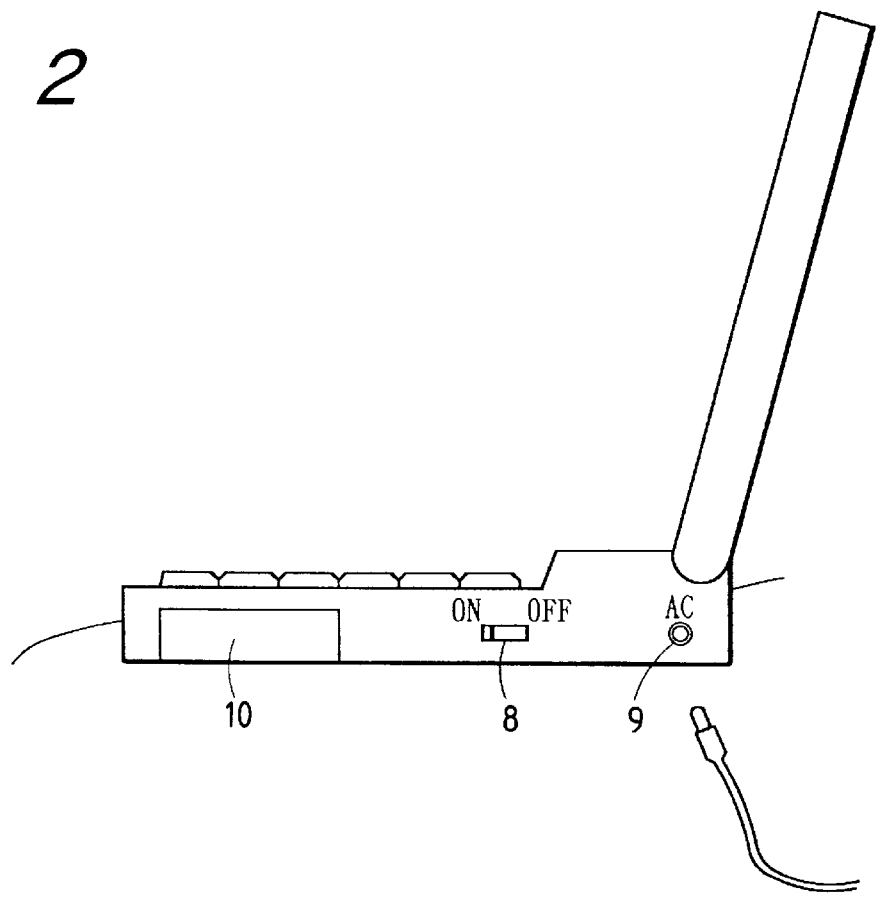
FIG. 2 is a side view of the portable information processing apparatus shown in FIG. 1.

FIG. 2 is a side view of the portable information processing apparatus shown in FIG. 1, and the same reference numbers as are used in FIG. 1 are also used to denote corresponding or identical components.

In FIG. 2, reference number 8 denotes a main power switch (main power SW); 9, an insertion port for an AC adaptor; and 10, a rechargeable battery pack that supplies power to the apparatus body 1 when an AC power source is not available.

Figure 3:
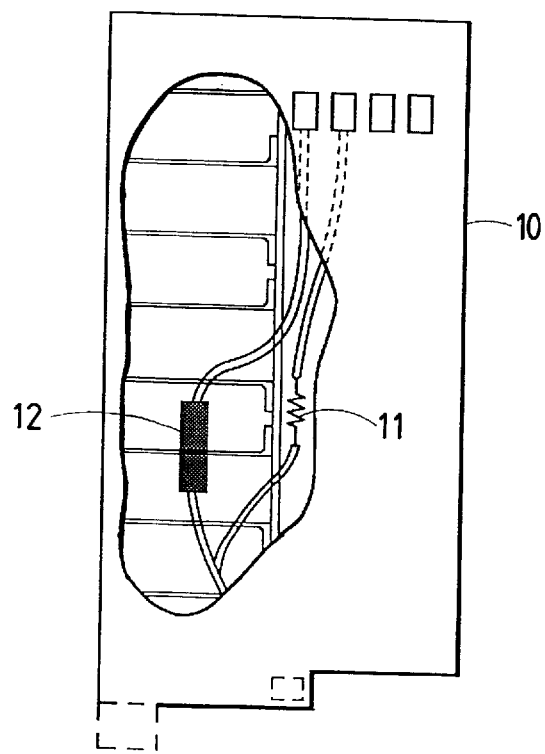
FIG. 3 is a detailed diagram with a partially cut away surface for explaining the structure of the essential portion of a battery pack shown in FIG. 2.

FIG. 3 is a detailed diagram with a portion partially cut away for explaining the structure of the essential portion of the battery pack 10 in FIG. 2. In an assembly nine secondary 1.2 V battery cells are connected in series, with two such assemblies being connected in parallel (only one assembly is shown). Two types of batteries are used for the battery pack 10: nickel-cadmium batteries and nickel-hydrogen batteries. They can be identified by the presence of a protrusion.

In FIG. 3 is shown a resistor 11 that monitors a current value of the row of nine batteries on one side, and a heat transmitter that monitors a temperature in the battery pack 10. A nominal voltage is 10.8 V, and a nominal capacity is 2900 mAh for a nickel-hydrogen (Ni—H) battery, and 2400 mAh for a nickel-cadmium (Ni—Cd) battery.

(Explanation of the electric block of the portable information processing apparatus)

The arrangement of the circuits, mainly a sub CPU 20 that controls battery management, of thus arranged portable information processing apparatus will now be explained while referring to FIG. 4.

Figure 4:
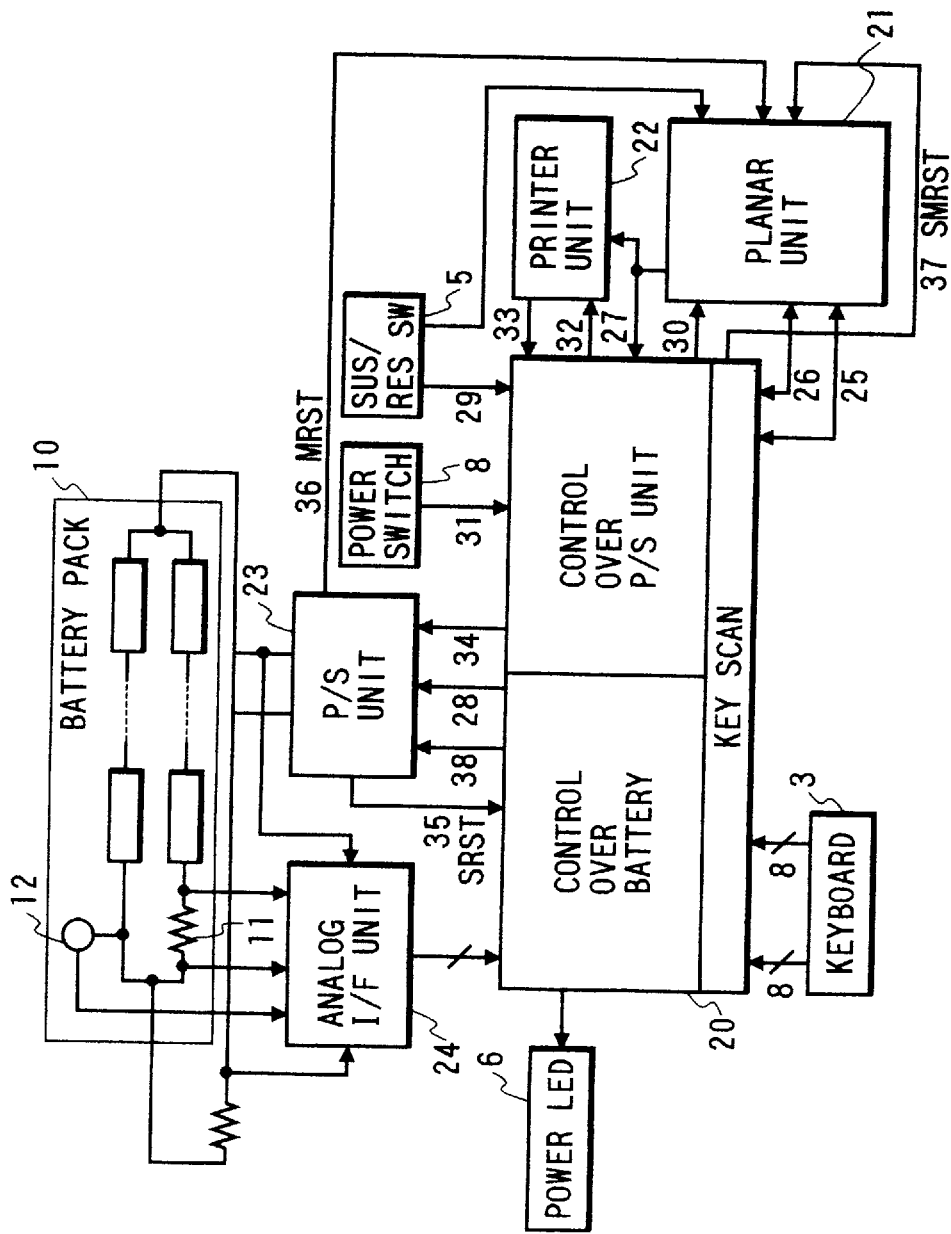
FIG. 4 is a block diagram for explaining the structure of a power supply control for the portable information processing apparatus shown in FIG. 1.

In FIG. 4, a planar unit 21, which is constituted mainly by a main CPU (not shown), primarily executes an application program. A printer CPU (not shown) in a printer unit 22 employs a control signal from the planar unit 21 and various sensor data in the printer unit 22 to control the driving of a carriage motor (not shown), ejection of ink through an ink-jet head (not shown), and the driving of a paper feed motor (not shown), and converts or processes, as needed, data that are transmitted via a data bus and prints the data.

The ink-jet printer unit 22 also incorporates a printer unit power supply circuit (not shown) that generates 20 V for driving the ink-jet head and 15 V for driving the motors by an AC adaptor (20 V) and a battery (10.8 V).

Power sources for this embodiment are the battery pack (a nominal voltage of 10.8 V), which is a secondary battery, and an AC adaptor (20 V). They are switched by an electric circuit in a power supply unit 23.

The power supply unit 23 includes a voltage converter for a main DC/DC (5 V, 5 A) and a suspend DC/DC (5 V and 0.5 A) and its controller, a generator of a reset signal (SRST; 35, MRST; 36) when the main power SW 8 is on, and a charger for the secondary battery (none of them shown).

The functions of the sub CPU 20 are roughly sorted into key scanning and battery management. The key scanning includes an operation for detecting a key depressed at a keyboard 3 by using an 8×8 matrix that consists of 16 input signal lines and for transmitting a code corresponding to the detected key input across a data line 25 and a clock line 26 to the planar unit 21; or an operation for setting a parameter that is related to the key input in consonance with a code that is transmitted from the planar unit 21 and for causing a key LED (not shown) to blink.

The battery management includes control of the battery, such as charging control and the detection of a remaining battery charge, and control of the power supply unit 23. For the former control, an analog interface unit 24 converts battery pack data into a voltage level that is appropriate for an AD input to the sub CPU 20. In consonance with the battery pack data, a remaining battery charge is displayed by the power LED 6, and full charging or errors during the charging are detected under the charging control by employing a charge request signal 38.

For the control of the power supply unit 23, there are full power down processing, resumption processing, and power OFF processing.

In the full power down processing, the sub CPU 20 receives a full power down signal 27, which is a condition control signal, from the planar unit 21, and transmits a main DC/DC control signal 28 to halt the transmission by the main DC/DC voltage converter (not shown), which is located in the power unit 23. Through this processing, the information processing apparatus enters the power saving state (suspend state), in which the supply of power is halted to all the electronic components, except for some components, such as the sub-CPU 20.

For recovering from the suspend state (resumption), the CPU 20 detects a resume signal 29 that is generated when a resume/suspend SW 5 is depressed, the DC/DC transmission is restarted by the main DC/DC control signal 28, and when the transmission becomes stable, a resume allowance signal 30 is transmitted to the planar unit 21.

In the power OFF processing, upon the receipt of an OFF signal for the power SW, the sub CPU 20 transmits an OFF request signal 32 to the printer unit 22 to receive an ACK signal, or outputs a power OFF signal 34 to the power supply unit 23 a constant time later to cut off the supply of power. The planar unit 21 can be reset by the reset signal (SMRST) 37.

In this embodiment, the power supply unit 23 is constituted by a one-chip microcomputer that restarts by performing a reset (a watchdog timer process) when there is no access of an internally provided I/O for a given period of time. When the one-chip microcomputer is reset, a reset start signal (MRST) 36 is output with a delay from the microcomputer to reset the other unit (planar unit 21) in order to match the reset phases of the microcomputer and of the other unit.

A program that is incorporated in the one-chip microcomputer executes a process wherein the halting of the transmission of the DC/DC converter is commanded in the power OFF processing and then the watchdog timer is restarted to repeat an endless loop of no operations, and a process whereby a signal (the reset start signal 36) for resetting the other unit is output several tens of msec following the start of the program after the microcomputer is reset.

As a result, for the portable information processing apparatus that has a time delay between the detection of the OFF state of the power SW 5 and the actual cutoff of the supply of power, even if the power SW 5 is turned off or on at any arbitrary time, the phases of the power supply unit 23, the power control unit (sub CPU 200), and the other unit (the planar unit 21) are matched and thereby the apparatus can positively be rebooted (reactivated).

Further, when a peripheral device is performing retraction processing, the supply of power is ensured regardless of the state of the power supply switch 8, and a reset signal is not output from a reset IC of the power supply unit 23, so that the retraction program in the peripheral device can be simplified.

In addition, since another function (e.g., keyboard control) can be provided for the one-chip microcomputer, a smaller portable information processing apparatus and greater savings in power can be anticipated due to the reduction in the number of required items.

(Analog Interface) The battery pack 10 of this embodiment has 18 (9×2) secondary batteries for driving the printer unit 22, as is described above. The probability for the occurrence of errors, such as a cell short circuit, is greater than that for a common battery pack. When charging of a battery pack that includes an abnormal cell is continued, the generation of abnormal heat and leakage will be caused. In this embodiment, to determine at an early state that an abnormality of the battery cells included in the battery pack exists, a branch current is detected in addition to the conventional detection of the temperature, a total current and a battery voltage of the battery pack, and is employed for checking the balance of a charge current.

The correspondence of this embodiment to the individual means of the present invention and the processing of the embodiment will now be described while referring to FIG. 4 and other diagrams.

According to the present invention, a portable information processing apparatus that processes data by employing power that is supplied from a rechargeable secondary battery (secondary cells in a battery pack 10), comprises: an analog unit (analog I/F unit 24) for monitoring a value of an analog current, which is discharged from the secondary battery, via the resistor 11 that is connected to the secondary battery; first conversion means (an internal A/D converter (not shown) of the CPU 20) for converting the analog current value monitored by the analog unit into the first digital current value at each specific cycle; second conversion means (provided as a function of the sub-CPU 20) for converting the first digital current value, which is acquired by the first conversion means, into a second digital current value by incrementing or decrementing the first digital value by an allowable conversion value that is set in advance; determination means (provided as a function of the sub-CPU 20) for comparing the second digital current value acquired by the second conversion means with the first digital current value, which is acquired by the first conversion means, to determine whether or not a change in the first digital value and in the second digital value are convergent within an area of the allowable conversion value; and holding means (an internal buffer (not shown)) for holding the first digital current value as a discharge current value of the secondary battery when the determination means determines that the change in the first digital current value is convergent within an area of the allowable conversion value. The A/D converter of the sub-CPU 20 converts an analog value of a current that is monitored by the I/F unit 24 into the first digital current value at each predetermined cycle; the sub-CPU 20 converts the first digital current value into the second digital current value that is incremented or decremented by the preset allowable conversion value; the second digital current value that is acquired by the conversion is compared with the first digital current value that is acquired by the first conversion means to determine whether or not changes of the first and the second digital values are convergent within an area of the allowable conversion value; and the internal buffer holds the first digital current value as a discharge current value for the secondary battery when the change in the first digital current value is convergent within an area of the allowable conversion value. In this manner, it is determined quickly whether there is noise influence, which occurs when an analog current value, which indicates the remaining charge on the secondary battery, is converted into a digital current value, so as to enable the detection of a proximate value for a discharge current value, for the secondary battery, from which the noise component is removed.

Further, according to the present invention, a portable information processing apparatus comprises: a table memory for storing a plurality of level tables that are employed for determining a battery remaining charge level in consonance with a discharge current value of a secondary battery; selection means for referring to the discharge current value held in the holding means (a buffer of the sub-CPU 20) to temporarily select one of the level tables to determine the remaining battery charge level of the secondary battery; change determination means (provided as a function of the sub-CPU 20) for, after the level table is selected by the selection means, determining whether or not the discharge current value of the secondary battery is convergent in a predetermined allowable change value range (determining by following the procedures shown in FIGS. 16A to 16B and 17A to 17B, which will be described later); and remaining battery charge level determination means (provided as a function of the sub-CPU 20) for, when the change determination means determines that the discharge current value of the secondary battery is convergent in the predetermined allowable change value range, comparing a voltage value of the secondary battery with a voltage value in the level table selected by the selection means to determine the remaining battery charge level. When a level table (see FIG. 14) is temporarily selected in consonance with the discharge current value held in the internal buffer to determine the remaining power level of the battery pack 10, and when the sub-CPU 20 determines that the discharge current value of the secondary battery is convergent in the predetermined allowable change range, the battery voltage of the battery pack 10 is compared with the voltage value in the selected level table and the battery remaining charge level is determined, so that, regardless of the fluctuation of a load, a battery remaining charge level can be determined quickly and comparatively accurately in consonance with the battery voltage of the battery pack 10.

In addition, according to the present invention, a portable information processing apparatus, which processes data by employing power that is supplied from a battery pack where secondary batteries rechargeable by an AC adaptor (not shown) are connected in parallel, comprises: an analog unit (an analog I/F unit 24) for monitoring a value of an analog current, with which the secondary batteries are charged, via a resistor that is connected to the secondary batteries; condition detection means (sub-CPU 20) for detecting condition data for the battery pack through the analog unit; remaining battery capacity determination means for employing the condition data detected by the condition detection means to determine a remaining battery capacity of the battery pack (employing a digital battery remaining value provided by the A/D converter of the sub-CPU 20 for determination); charging control means (the power supply unit 23) for controlling the charging of the battery pack in consonance with the remaining battery capacity determined by the remaining battery capacity determination means; and error detection means (the sub-CPU 20) for determining a current balance between the secondary batteries in the battery pack and detecting a charging error for each predetermined period of time that is consonant with the remaining battery capacity following a charging start by the charging means. When the sub-CPU 20 acquires the condition of the battery pack 10 detected by the analog I/F unit 24, the remaining battery power of the battery pack 10 is determined in consonance with the condition data, and the power supply unit 23 begins to charge the battery pack 10 according to the determined remaining battery charge value. At each predetermined period of time that is consonant with the remaining battery charge value, the sub-CPU 20 examines a current balance between the secondary battery rows of the battery pack to detect a charging error (by referring to the temperature, the battery voltage, the total current, the total voltage, and the branch current of the battery pack 10 in this embodiment), and determines whether an unbalanced current to the battery rows of the battery pack is caused by the potential of the battery pack before the charging began, or is caused by the deterioration of the secondary batteries. When an unbalanced current to the battery rows of the battery pack is caused by the potential of the battery pack before the charging is begun, this is not regarded as a charging error and charging can continue to be performed.

According to the present invention, a portable information processing apparatus, which has a plurality of units (the planar unit 21, the printer unit 22, etc.) to process data by employing power that is supplied from a battery pack where secondary batteries rechargeable by an AC adaptor are connected in parallel, comprises: power supply means (the power supply unit 23) for supplying a predetermined potential to the units when a current flows from the battery pack 10, or for halting the supply; instruction means (the power switch 8) for instructing the supply of a current and the halting of the supply from the battery pack 10; and power source control means (the power unit 23) for detecting an instruction for the halting of the supply that is issued by the instruction means and for controlling a time for the halting of the supply of power from the power supply means to the units in consonance with an I/O monitoring state within a predetermined period. The OFF instruction for the power switch 8 is detected, and the power supply unit 23 controls the time for the halting of the supply of power to the individual units in consonance with the I/O monitoring condition for a predetermined period of time, so that the power can be turned off at such a time following the turning off of the power switch 8 that there is no interference with individual units.

The input/output characteristics of the temperature, the battery voltage, the total sum, and the branch current of the battery pack, relative to the analog interface unit 24 shown in FIG. 4, will now be described while referring to FIGS. 5A to 5C.

Figure 5A:
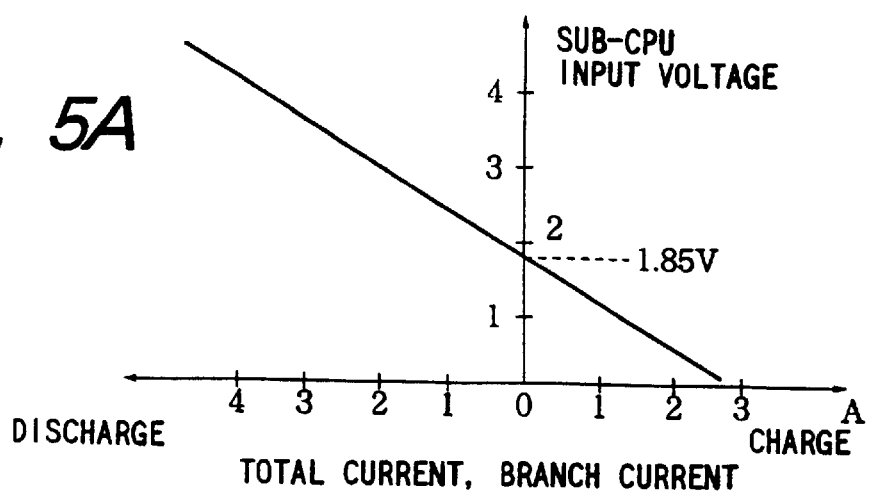
FIGS. 5A through 5C are characteristic graphs for explaining an input/output characteristic of the battery pack shown in FIG. 3.
Figure 5B:
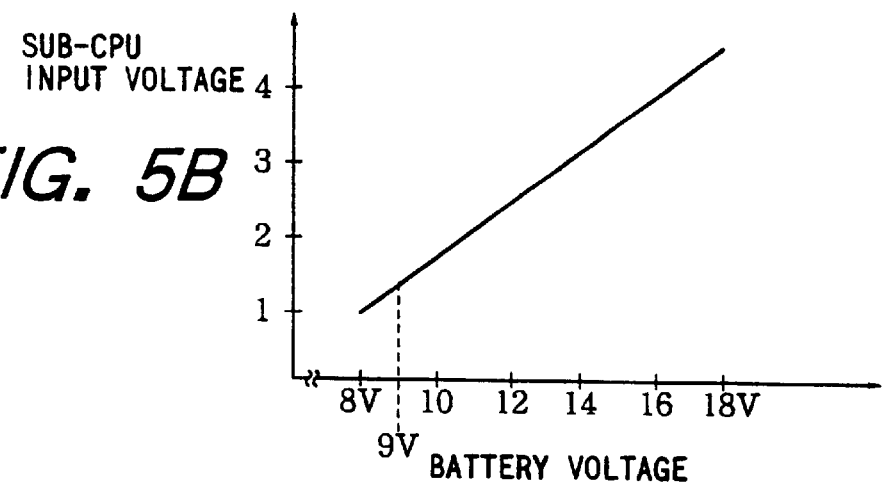
Figure 5C:
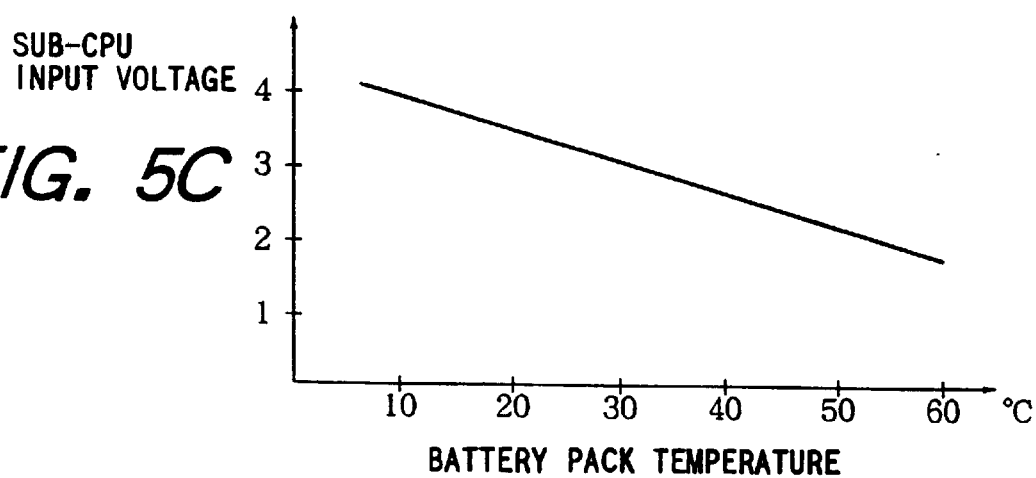

FIGS. 5A through 5C are characteristic graphs for explaining the input/output characteristics of the battery pack 10 shown in FIG. 3. The graph in FIG. 5A shows the characteristic of the total current/branch current; the vertical axis represents the sub-CPU input voltage and the horizontal axis represents discharge current (A) or charge current (A). The graph in FIG. 5B shows the battery voltage characteristic; the vertical axis indicates a sub-CPU input voltage, and the horizontal axis indicates battery voltage (v). The graph in FIG. 5C indicates the characteristic of the battery pack temperature; the vertical axis represents a sub-CPU input voltage and the horizontal axis represents the temperature (°C.) of the battery pack 10.

As is shown in FIG. 5A, the charging and the discharging of the total current and the branch current is performed through a single AD input terminal of the sub-CPU 20 via the analog interface unit 24. Compared with a method by which corresponding AD terminals are provided for charging and discharging, an interface circuit can be simplified and detection errors between the devices, which is caused by a variation in the accuracy of components, can be reduced. In addition, the number of signals that are input to the sub-CPU 20 is also small.

(Control performed by the sub-CPU)

The main routine of the sub-CPU 20 in a thus arranged portable information processing apparatus will now be explained while referring to the flowchart in FIG. 6.

FIG. 6 is the flowchart showing one example main routine for the sub-CPU 20 in the portable information processing apparatus according to the present invention. It should be noted that reference numbers (1) through (13) denote steps. This processing is begun by a watching reset or upon receipt of the reset signal (SRST output) 35 by the sub-CPU 20.

When the main power SW 8 is turned on, the transmission by the suspend DC/DC converter, which is provided in the power supply unit 23, is unconditionally begun and the supply of power to the sub-CPU 20 is started. When a voltage reaches 4.2 V, a 40 msec wide reset signal (SRST output) 35 for the sub-CPU 20 is output from the reset IC in the power supply unit 23. When the reset signal is released, the sub-CPU 20 begins the execution of a program at the head address (0C000h) in the incorporated ROM area. The reset IC outputs the reset signal (MRST) 36 for the planar unit 21 400 msec after the output of the SRST 35. During the period of 400 msec, the main DC/DC converter performs transmission unconditionally, and it is ensured that an overload is not placed on the suspend DC/DC converter even while the signal line on the planar unit side is unstable during the reset.

When the SRST 35 is released, the sub-CPU 20 unconditionally forwards signals that are transmitted from the main DC/DC and the suspend DC/DC converters to the power supply unit 23, and the supply of power to the entire apparatus is begun at step (1). After waiting for 50 msec, until the transmission of the DC/DC converter becomes stable at step (2), the sub-CPU 20 outputs the SMRST signal 37 to the planar unit 21 at step (3) and resets the planar unit 21.

The SMRST signal 37 is meaningless because the MRST signal 36 is output in the normal power-ON state. However, as will be explained for the OFF process of the power SW 8, a time lag of several seconds sometimes occurs between the time that the power SW 8 is turned off and the time that the supply of power is actually cut off. When the power SW 8 is turned on again during such a time lag period, the MRST signal 36 may not be output from the reset IC of the power supply unit 23. In such a case, the SMRST signal 37 is output from the sub-CPU 20 to reset the planar unit 21.

Then, the initial setup routine that relates to an input/output port and an interrupt is performed at step (4). In this embodiment, four interrupts are employed: three external interrupts, for the turning off of the power SW 8, for the forwarding of the resume request to recover from the suspend state, and for the inserting of an AC adaptor; and a key control interrupt, which is used to output a key control command from the planar unit 21 to the sub-CPU 20. At the initial setup at step (4), these interrupts, except for the one that is provided for the turning off of the power SW 8, are inhibited.

The key control interrupt is permitted in key scan processing, and the interrupts for the insertion of the AC adaptor and of the resume request are permitted in full power down processing, which will be described later.

At the end of the initial setup at step (4), a check is also performed for the incorporated ROM, the writing/reading of the incorporated RAM, and the blinking of the LED that can be directly driven from the I/O port of the sub-CPU 20.

The main loop in the main routine can be roughly divided into three blocks: a remaining charge detection block for detecting the remaining battery charge; a key scanning block for using an I/O sensor to detect the depression of a key on the key matrix, and for transmitting a corresponding code to the planar unit 21; and an I/O sensing block for detecting a full power down signal, or for detecting the presence of an AC adaptor and the battery pack 10.

These three blocks are sequentially executed in the main loop, and a timer that acquires the timing for execution is started before program control enters the main loop at step (5).

Following this, at step (6), the detection of the remaining battery charge of the battery pack 10 is performed by following the procedures for the remaining charge detection routine which will be described later, and the result is displayed by the power LED.

After the key scanning is performed for 300 msec at steps (7) and (8), a check is performed at step (9) to determine whether or not a full power down signal from the planar unit 21 is detected. When the full power down signal is detected, at step (10), program control branches to full power down processing, which will be described later.

If, at step (9), the full power down signal is not detected, at step (11) a check is performed to determine whether or not an AC adaptor is connected. When an AC adaptor is connected, program control returns to step (6) and the main loop is repeated.

If, at step (12), an AC adaptor is not connected, power is being supplied by the battery pack 10, and a flag (full charge flag) that indicates the battery pack 10 is fully charged is cleared. As the result of the remaining battery charge detection, at step (12) a check is performed to determine whether or not the remaining battery charge level is low. When the battery charge level is not low, program control returns to step (6) and the main loop is repeated.

When, at step (12), the battery charge level is low, at step (13) low battery processing, which will be described later, is performed and thereafter program control returns to step (6).

(Low battery processing)

An explanation will be given while referring to FIG. 7 for the low battery processing that is performed when the remaining charge of the battery pack 10 is determined to be low and the AC adaptor is not connected.

Figure 7:
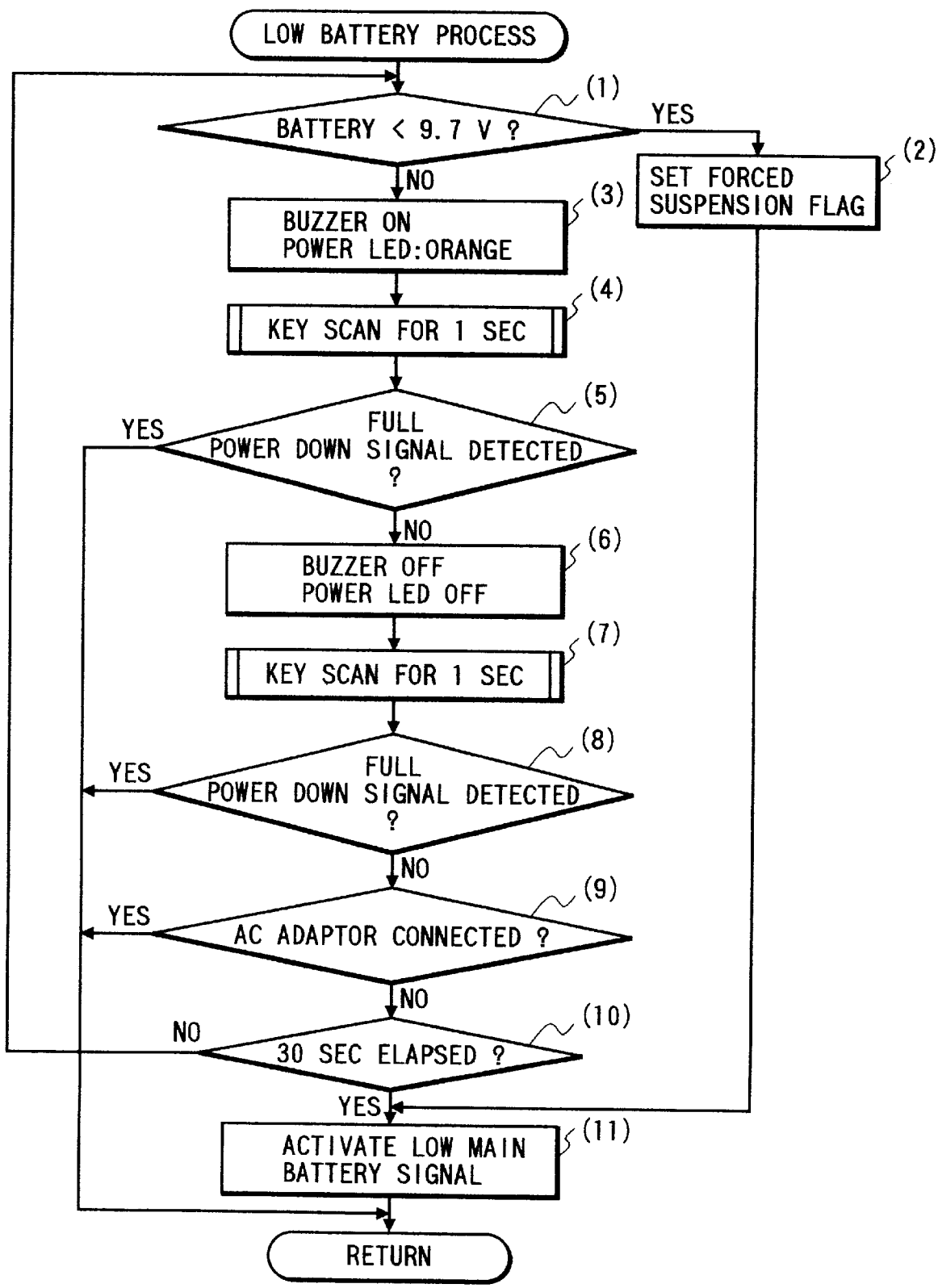
FIG. 7 is a flowchart showing detailed example procedures of a low battery processing routine shown in FIG. 6.

FIG. 7 is a flowchart showing detailed example procedures of the low battery process routine shown in FIG. 6. It should be noted that numbers (1) through (11) denote steps.

In the low battery process (low suspension), a user is warned that a low battery charge condition exists by a buzzer and the blinking of the power LED 6, and when 30 seconds have elapsed following the detection of the low charge level, the apparatus is shifted to the suspend mode (the power saving mode) by a battery low signal.

When the voltage of the battery pack 10 is lower than 9 V after the apparatus is shifted to the suspend mode, the power supply unit 23 forcibly halts the supply of power from the battery pack 10 to the apparatus in order to prevent overdischarge (hardware forced OFF operation). If an AC adaptor is connected before the battery voltage falls below 9 V, the data that are present immediately before the apparatus is shifted are also held.

In the normal use of the battery pack 10 (when a current is discharged from a fully charged battery pack 10), the battery voltage 30 seconds after the detection of a low charge level is reduced only 0.1 to 0.2 V. For a battery whose charging depth is shallow (battery charging from a fully discharged state is completed within several minutes), a voltage drop of approximately 1 V occurs only several seconds later. Therefore, before the low suspension is performed, the battery voltage falls below 9 V and the hardware forced OFF operation occurs, so that the data that are being created may be lost.

Thus, at the beginning of the low battery process, an AD conversion of the battery voltage is performed, and at step (1) a check is performed to determine whether or not the battery voltage is lower than 9.7 V. If the decision is YES, it is highly probable that the hardware forced OFF operation will be performed before 30 seconds have elapsed. At step (2) a forced suspension flag is set and program control moves to step (11).

If, at step (1), the battery voltage is 9.7 V or higher, a buzzer is switched on and the power LED 6 blinks orange at step (3), and key scanning is performed for one second at step (4). When a user is alerted by the alarm and depresses the suspend/resume SW 5, retraction is performed for the planar unit 21 and a full power down signal is output. Then, at step (5) a check is performed to determine whether or not the full power down signal is detected. If the full power down signal is detected, the low battery process is terminated, program control returns to the main loop, and the full power down process, which will be described later, is performed.

If, at step (5), the full power down signal is not detected, the buzzer and the power LED 6 are turned off at step (6), and the key scanning is performed for one second as was previously performed at step (7). When the full power down signal is detected at step (8), the low battery process is terminated.

Consecutively, when, through the procedure at step (6), a user is alerted by the alarm and inserts the AC adaptor at step (9), the supply of power is ensured, so that the low battery process is terminated.

At step (10), a check is performed to determine whether or not 30 seconds have elapsed following the beginning of the low battery process. When 30 seconds have not yet elapsed, program control returns to step (1) and the above described process is repeated.

If, at step (10), 30 seconds have elapsed, at step (11) a low main battery signal is output to the planar unit 21 to force the planar unit 21 to perform the retraction process and to output a full power down signal, and the low battery process is thereafter terminated.

The planar unit 21 that receives the low battery signal performs the same process as when the suspend/resume SW 5 has been depressed. After the retraction process is performed, the planar unit 21 outputs the full power down signal to the sub CPU 20 and the printer unit 22.

(Full power down process)

An explanation will now be given, while referring to the flowchart in FIG. 8, for the full power down process that is called up when the full power down signal is detected during the I/O sensing operation in the main routine.

Figure 8:
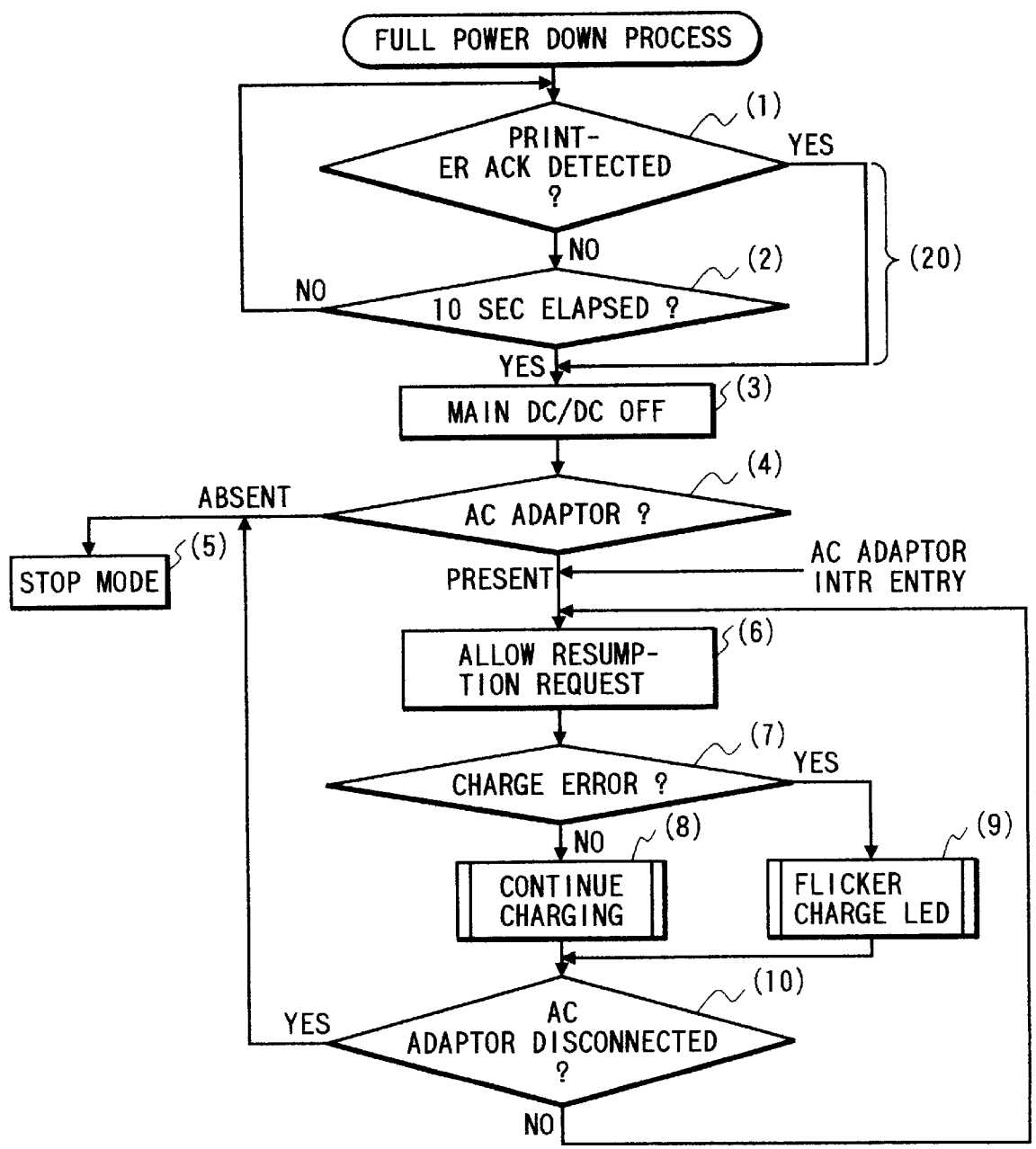
FIG. 8 is a flowchart showing detailed example procedures of a full power down processing routine shown in FIG. 6.

In the flowchart in FIG. 8 are shown detailed example procedures for the full power down processing routine in FIG. 6. It should be noted that numbers (1) through (10) denote steps.

In this embodiment, when the suspend/resume SW 5 is depressed in the normal operating state, the planar unit 21 performs the power down process for the I/O devices (an HD, an FD, an LCD, a memory card, etc.) and prepares for the recovery, and then outputs a full power down signal to the printer unit 22 and the sub-CPU 20 at the same time.

Upon receipt of the full power down signal, the printer unit 22 prepares for the recovery and retracts the ink-jet head to a reference position for protection. Logic power for controlling the printer unit 22 is supplied by the main DC/DC converter of the power supply unit 23, and the transmission of the main DC/DC converter and its halting is controlled by the sub CPU 20.

First, at steps (1) and (2), a check is performed to determine whether or not the sub-CPU 20 has detected an ACK signal, which is transmitted by the printer unit 22 when the retraction is completed, and whether or not ten seconds have elapsed following the detection of the full power down signal. When both decisions are YES, at step (3) the transmission by the main DC/DC converter is halted, and the entire apparatus, except for such component as the sub-CPU 20, is temporarily halted (suspended) and set in the power saving state.

Next, at step (4) a check is performed to determine the presence of the AC adaptor. When the AC adaptor is not present, at step (5) the sub-CPU 20 enters the temporarily halted state (in the stop mode), so that the apparatus is in a state where more power is saved.

The apparatus is recovered from the stop mode by the insertion of the AC adaptor, and by a resume request that is originated by the depression of the suspend/resume SW 5 and the turning off of the power SW 8. These two events are masked at the initial setup at step (4) in FIG. 6. Before the apparatus enters the stop mode, the two external interrupts are permitted. When, at step (6), an interrupt for the insertion of the AC adaptor occurs, program control executes the charging, which will be described later.

When, at step (4), the AC adaptor is present, the charging that will be described later is performed. Before the charging, at step (6) a resume request is permitted as well as the above, and a check is performed at step (7) to determine whether or not an error has occurred during the charging. If the decision is NO, the charging that will be described later is continued at step (8).

The processing is interrupted when one of the following occurs: the turning off of the power SW 8 during the charging; the entry of a resume request; the removal of an AC adaptor; or detection of an error during the charging. The turning off the power SW 8 and the entry of a resume request are detected by interrupts, and program control branches to the power OFF process and the resume request interrupt process, which will be described later.

At step (10), a check is performed to determine whether or not the AC adaptor is extracted during the charging. If the decision is NO, program control returns to step (6). If the decision is YES, program control goes to step (5), where the apparatus enters the stop mode.

If, at step (7), an error has occurred during the charging, at step (9) a charge LED blinks at a cycle of 0.3S to notify a user to replace the battery pack 10. Program control thereafter goes to step (10).

(Resume request interrupt process)

The details of the resume request interrupt process in FIG. 8 will now be described while referring to a flowchart in FIG. 9.

Figure 9:
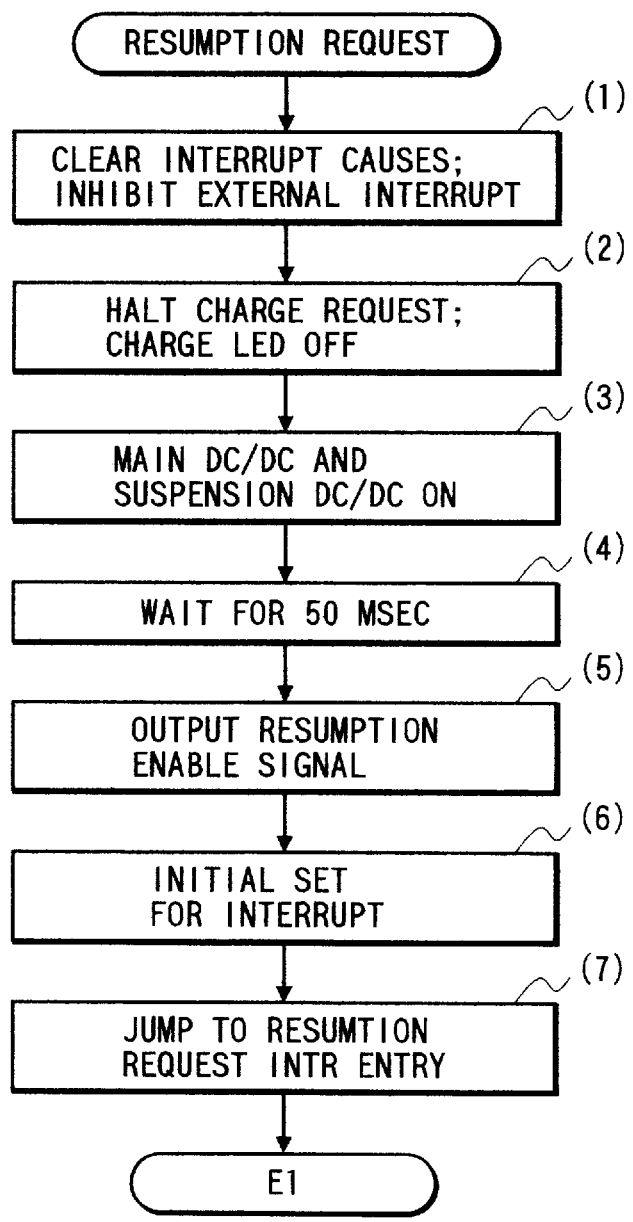
FIG. 9 is a flowchart showing detailed example procedures of a resumption request interrupt processing routine shown in FIG. 8.

In the flowchart in FIG. 9 is shown the detailed example procedures for the resume request interrupt process in FIG. 8. It should be noted that numbers (1) through (7) denote individual steps.

When the apparatus is to recover from the power saving state (the suspend state) where the transmission of the main DC/DC converter is halted and the supply of power to the apparatus is halted, except for specific devices such as the sub-CPU 20, a resume request signal, which is generated when the suspend/resume SW 5 on the top surface of the apparatus is depressed in the suspend state, is employed as a trigger signal. Upon this signal, the routine is branched to the external interrupt process.

First, at step (1) the interrupt factors are cleared and all the other external interrupts are masked. A request for charging, which is output to the power supply unit 23, is canceled to halt the charging, and at the same time, the charge LED is turned off (step (2)). Then, at step (3), the main DC/DC converter that is halted during the full power down processing begins transmission. After the elapse of an interval of 50 msec to allow for the stabilization of the transmission of the main DC/DC converter (step (4)), a resume enable signal is output that is employed as a trigger for the recovery of the planar unit 21 (step (5)). At step (6), the initial setup for the interrupt that is masked at step (1) is performed, and program control advances to step (7) to return to step (5) in FIG. 6, which is the step immediately before the main routine loop in FIG. 6 wherein the main loop of the remaining charge level detection, the key scanning and the I/O sensing is repeated.

It should be noted that, upon receipt of a resume enable signal, the planar unit 21 resumes the operation of the I/O devices in the state in which they were immediately before the full power down.

(Power OFF interrupt process)

The OFF signal from the power SW 5 is input at the external interrupt terminal of the sub-CPU 20, and is set to the highest interrupt level of all the other interrupt factors at the initial setup at step (4). Thus, whatever state the sub-CPU 20 is in, the interrupt process in FIG. 10 is performed first.

The power OFF interrupt process for the portable information processing apparatus according to the present invention will now be described while referring to a flowchart in FIG. 10.

Figure 10:
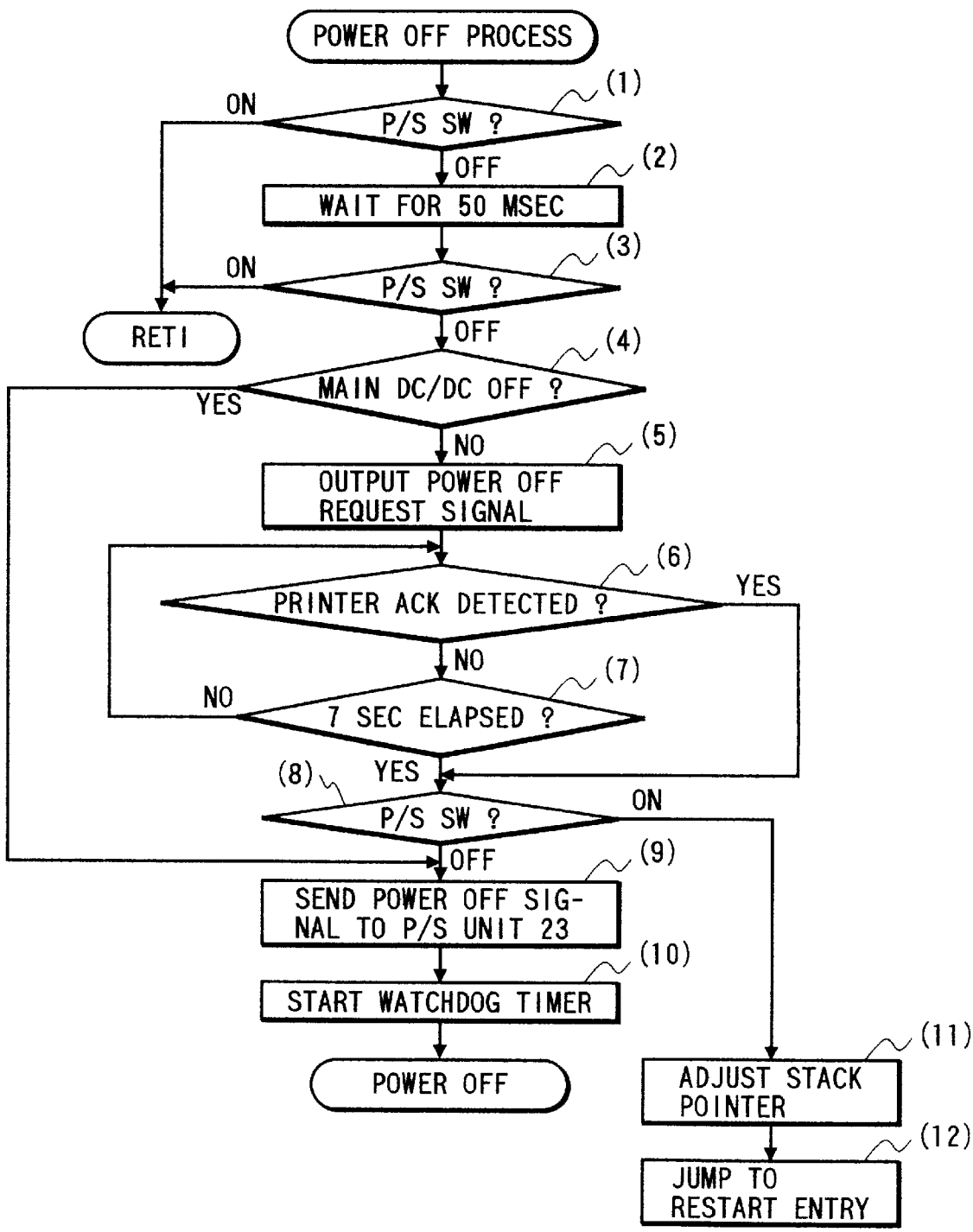
FIG. 10 is a flowchart showing power OFF interrupt example procedures performed by the portable information processing apparatus according to the present invention.

In the flowchart in FIG. 10 are shown example procedures of the power OFF interrupt process for the portable information processing apparatus according to the present invention. It should be noted that numbers (1) through (12) denote individual steps.

Since a power OFF signal is directly transmitted from the power SW 5, the signal tends to be affected by noise, etc..

Therefore, at step (1), the state of the port of the power SW 5 is detected at the beginning of the interrupt process. When the port is in the ON state, the current process is halted and program control returns to the process that was being performed before an interrupt occurred.

When, at step (1), the port of the power SW 5 is in the OFF state, after a pause of 50 msec at step (2), the port of the power SW 5 is examined again at step (3). When the port is in the ON state, in the same way as is described above, the current process is halted and program control returns to the process that was being performed before an interrupt occurred. When the port is in the OFF state, the power OFF process is continued.

Consecutively, at step (4) a check is performed to determine whether or not the current operating state of the battery pack 10 is the suspend state (where the transmission of the main DC/DC converter is halted). When the battery pack 10 is in the suspend state, the units other than the sub-CPU 20 are already halted, and program control goes to step (9) and the following steps to halt the supply of power.

When, at step (4), the battery pack 10 is in the normal operating state (during the transmission by the main DC/DC converter), at step (5) a power OFF request signal is output to the individual units to request the units to perform the retraction process that is necessary for powering off. Especially in this embodiment, since the portable information processing apparatus that incorporates the above described ink-jet printer unit is employed, it is required, as well as for the full power down process, that the halting of the supply of power be delayed until the protection of the ink-jet head is completed. Thus, similarly to the full power down process, either at step (6) an ACK signal from the printer unit 22 is detected, or at step (7) the apparatus waits for seven seconds following the turning off of the power SW 5. Since the power SW 5 may be on again during the waiting period, at step (8) the state of the power SW 5 is checked at the end of the waiting period and before the supply of power is halted. When the power SW 5 is in the ON state, at step (11) a stack pointer is adjusted to the head address (0C000h) of the program, and at step (12) program control jumps to the restart of the entry.

If, at step (8), the power SW 5 is in the OFF state, at step (9) a power OFF signal is transmitted to the power supply unit 23, and the transmission by the main DC/DC converter and of the suspend DC/DC converter is halted, thus halting the supply of power to the entire apparatus.

Figure 11A:
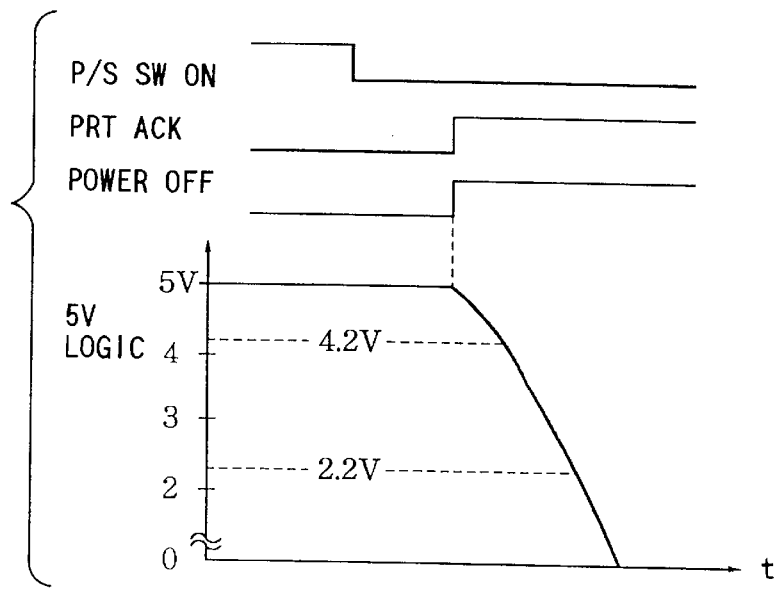
FIGS. 11A and 11B are graphs showing transient voltage characteristics of the portable information processing apparatus according to the present invention when power is on/off.
Figure 11B:
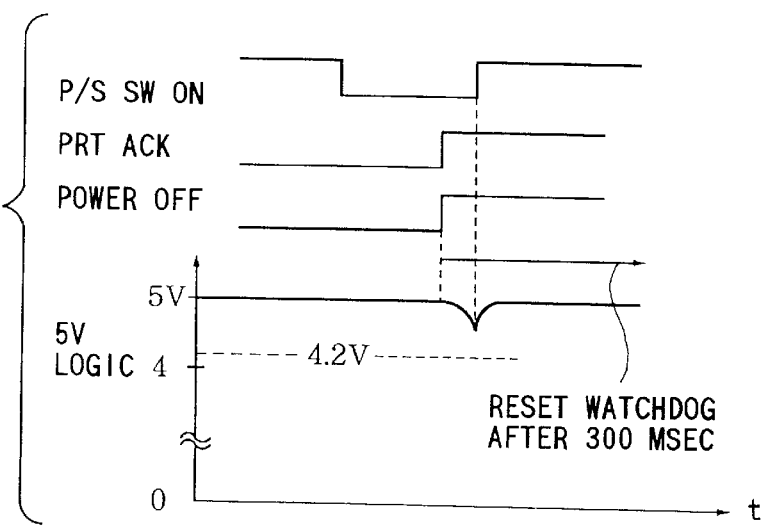

When the transmissions of the DC/DC converters are halted, the logic voltage of the entire apparatus gradually falls from 5 V, as is shown in FIG. 11A. Due to the capacity components that are present in the electric circuit, several tens of msec are required until the voltage is reduced to a voltage (4.2 V) at which the reset IC of the power supply unit 23 begins to output the reset signal SRST 35 to the sub CPU 20. One hundred plus several tens of msec are required until the voltage is reduced to a voltage (2.2 V) at which the driving of the sub-CPU 20 is stopped.

When the power SW 5 is turned on again within several msec following the halting of the transmission by the DC/DC, the suspend DC/DC begins transmission regardless of whether or not the sub-CPU 20 outputs a transmission halt signal. In addition, since the voltage is not lower than 4.2 V, the SRST signal 35 is not output from the reset IC of the power supply unit 23. In this case, even though the state of the power SW 5 is changed from OFF to ON, the apparatus is not rebooted.

Although a method may be employed for also detecting the state of the power SW 5 after the transmission of the DC/DC converters is halted, a detection signal is not very reliable because it is generated after the supply of power is halted, and there may be mistaken operation due to noise.

In this embodiment, therefore, at step (9) the transmission of the DC/DC converters is halted by a power OFF signal, and at step (10), a 300 msec the watchdog timer, which is incorporated in the sub-CPU 20, is activated. A loop of no-operation instructions is repeatedly performed.

The counting for the watchdog timer is performed by the internal hardware of the sub-CPU 20. When the sub-CPU 20 is driven even after 300 msec have elapsed, i.e., when the transmission of the suspend DC/DC converter is continued, processing is forced to restart (watchdog reset) at the head address (0C000h) of the program.

Both when the processing is begun by a watchdog reset (see FIG. 6 for the details) and when the processing is voluntarily restarted at step (11), the sub-CPU 20 outputs the SMRST signal 37 to the planar unit 21, as is described at step (3) in FIG. 6, to reset the entire apparatus so as to enable rebooting.

(Remaining battery charge detection process)

The remaining battery charge detection process that is performed at a cycle of 300 msec will now be explained while referring to a flowchart in FIG. 12.

Figure 12:
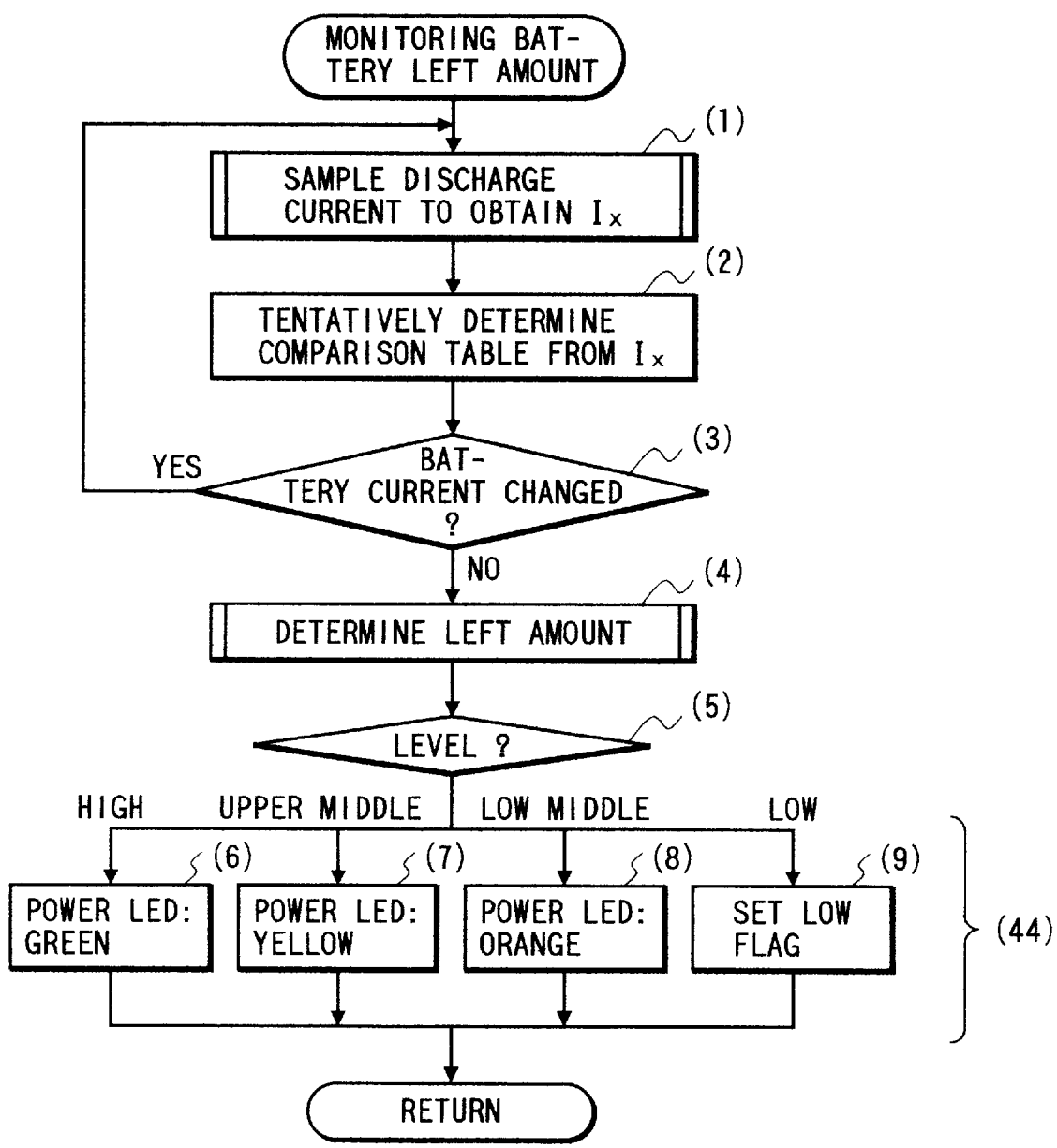
FIG. 12 is a flowchart showing detailed example procedures of a remaining battery charge monitoring routine shown in FIG. 6.

In the flowchart in FIG. 12 is shown detailed example procedures of the remaining battery charge monitoring routine in FIG. 6. It should be noted that numbers (1) through (9) denote individual steps.

In this embodiment, processes for the three blocks (remaining battery charge detection, key scanning, and I/O sensing) are performed in the main loop, as is described above. The processes other than key scanning must be performed at high speed in order to precisely detect the depression of a key. In this embodiment, therefore, the remaining battery charge detection is performed as will be described later in order to provide fast remaining charge detection with no degradation of the detection accuracy.

First, at step (1), an AD conversion value (discharge current) Ix that corresponds to the total current is acquired by performing a remaining battery sampling routine, which will be described in detail in FIG. 13. Then, at step (2), a remaining battery charge comparison table that is to be employed is temporarily determined by referring to the discharge current Ix.

In this embodiment, as is shown in FIG. 14, remaining comparison tables are prepared for 8 levels of discharge currents (250 mA<Ix, 250 mA<Ix<750 mA, 750 mA<Ix<1250 mA, 1250 mA<Ix<1750 mA, 1750 mA<Ix<2250 mA, 2250 mA<Ix<2750 mA, 2750 mA<Ix<3250 mA, 3250 mA<Ix).

The time required for temporary determination of a comparison table is about 20 μsec in this embodiment. Since the remaining battery charge detection is asynchronously performed with the operations of the individual units (an FD, an HD, a printer, etc.), it is probable that the discharge current will be changed during the 20 μsec period.

Values that correspond to the upper and the lower limits of the discharge current level that is temporarily determined are employed to perform sense conversion for a discharge current in order to detect the change in a load (step (3)). More specifically, as in the removal of noise that occurs during the detection of a discharge current value, which will be described later, the change in a load is examined by performing sense conversion using Ix±130 mA. If the change in a load that can not be ignored is detected, program control returns to step (1) and the acquisition of the AD conversion value Ix is performed again.

In this embodiment, a rounding error that is produced by calculating the proximate value of the discharge current at step (2) is defined as 250 mA at the maximum, which is the limit for increasing detection accuracy. Thus, in the noise removal at step (1) and the detection of the change in the load at step (3), sense conversion of a discharge current is performed at a range of 250 mA (±130 mA), so that an economical, minimum required processing time is provided.

When, at step (3), the decision is NO, i.e., if the change in the load is within an allowable range, at step (4) a remaining battery charge level determination routine is executed to determine the remaining battery level by using the temporarily determined comparison table. It should be noted that in the comparison table, while a discharge period from the fully charged state to a fully discharged voltage (9 V) is 100%, a battery voltage for a remaining charge of 85%, a battery voltage for a remaining charge of 20%, and a battery voltage for a remaining charge of 10% are entered, for each of eight discharge current levels, as a remaining slice voltage together with a remaining charge level.

A remaining charge level is determined at step (5). The color of the power LED 6 that is turned on is consonant with the determined remaining power level (steps (6) through (9)). Program control thereafter terminates the remaining battery charge detection process.

Figure 13:
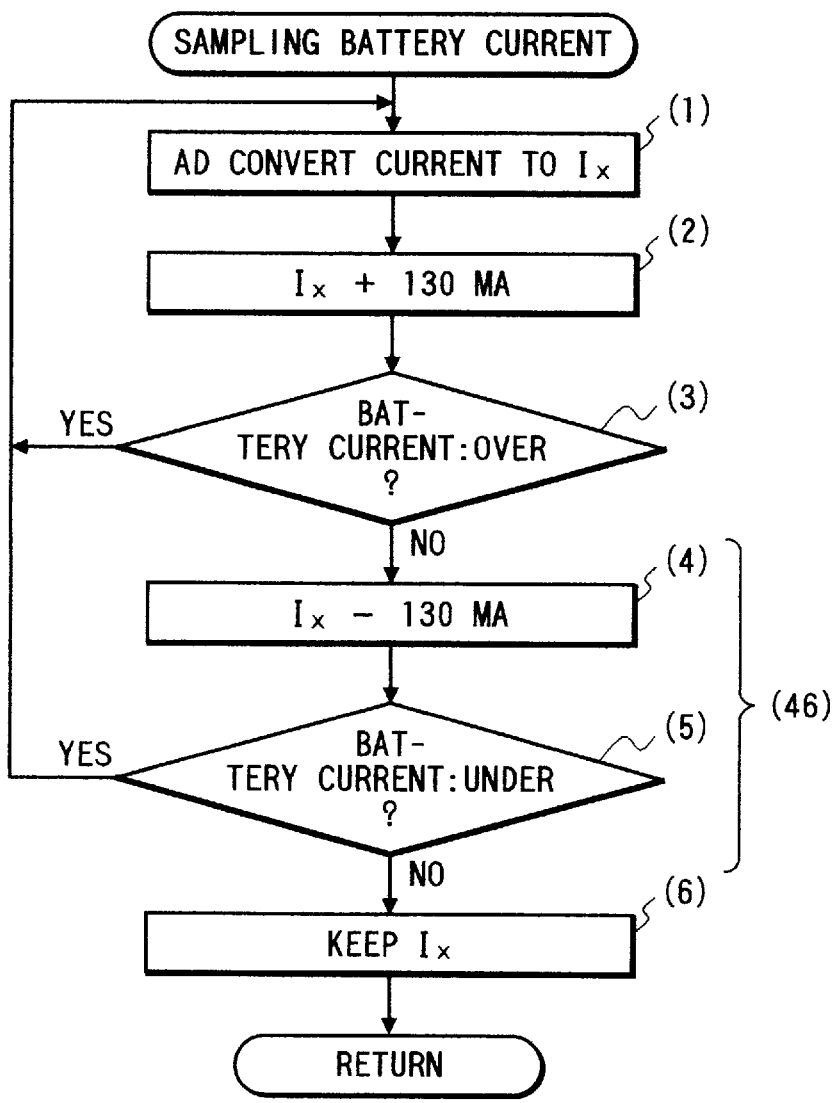
FIG. 13 is a flowchart showing detailed example procedures of the discharge current sampling routine shown in FIG. 12.

FIG. 13 is a flowchart showing detailed example procedures of the discharge current sampling routine shown in FIG. 12. It should be noted that numbers (1) through (6) denote individual steps.

The sub-CPU 20 that is employed in this embodiment requires 18 μsec for a single AD conversion.

First, at step (1), AD conversion is performed for the total battery current. In this case, since the main DC/DC converter is in the operating state during the detection of the remaining battery charge, noise that is too great to be ignored is probably carried on the AD conversion current. To remove the noise, at step (2) or (4), a value that corresponds to AD conversion value Ix±130 mA is employed to perform sense conversion for a voltage at an input terminal that corresponds to the total current. In this embodiment, the sense conversion is one type of AD conversion and is faster (5 μsec) than common AD conversion because, according to this mode, an analog voltage at an analog input port is compared with a value that is designated by a program.

Then, at steps (3) and (5), a check is performed to determine whether or not there is a change in a current that is +130 mA or higher, or −130 mA. When there is such a change, it is assumed to be noise and program control returns to step (1) whereat the AD conversion is performed again.

If, at step (5), the change falls within the allowable range, the current AD value is held at step (6) and program control thereafter returns to the remaining battery charge detection process. Through these procedures, the removal of noise from the AD conversion value Ix is completed in about 30 μsec (18+5+5) at the minimum.

The remaining battery charge level determination process shown in FIG. 12 will now be explained while referring to a flowchart in FIG. 15.

Figure 15:
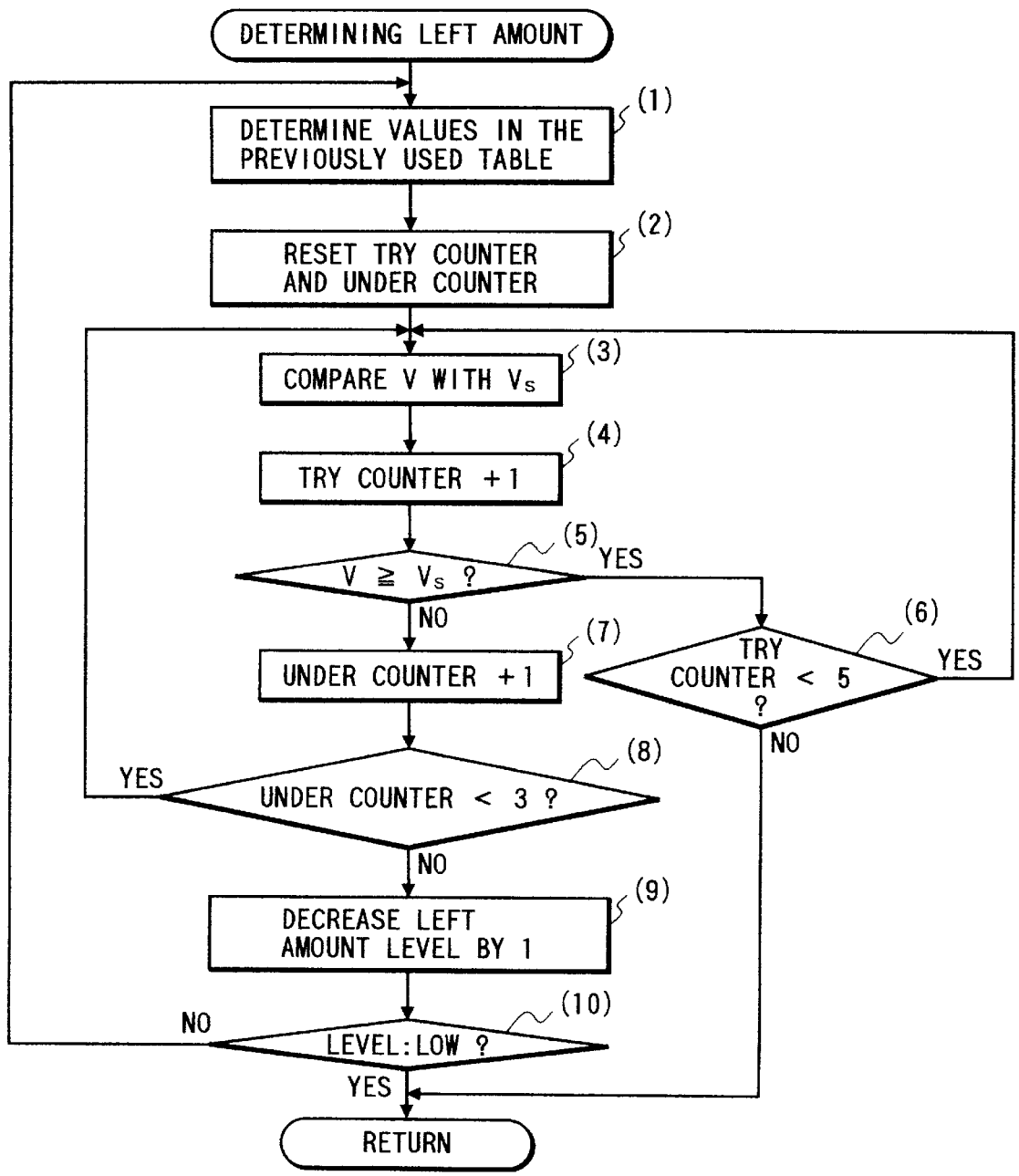
FIG. 15 is a flowchart showing detailed example procedures of the remaining battery level determination routine shown in FIG. 12.
Figures 16, 16A, 16B:
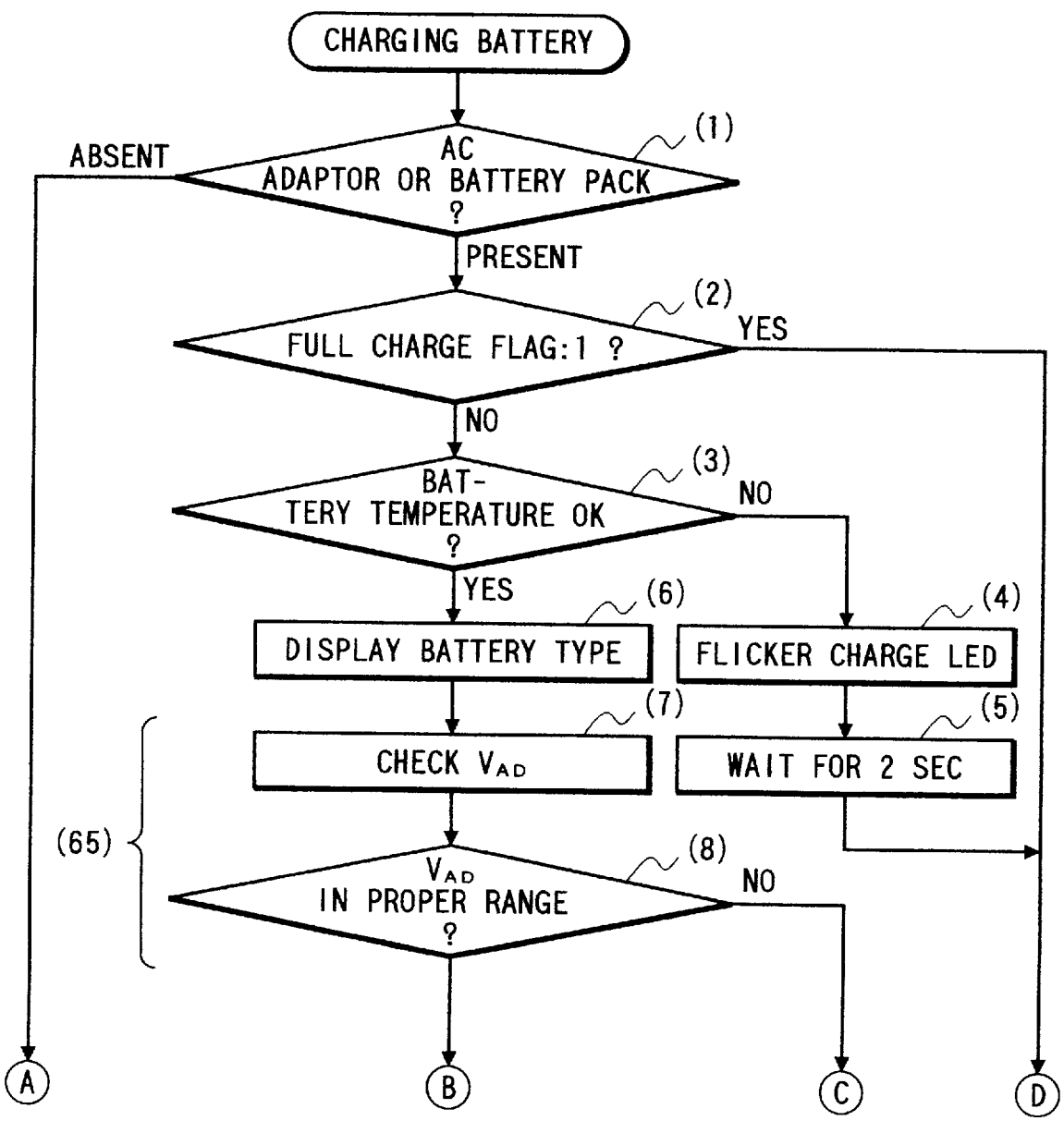
FIG. 16 is comprised of FIGS. 16A and 16B showing flowcharts of detailed example procedures of the battery charging routine shown in FIG. 8.
Figure 16B:
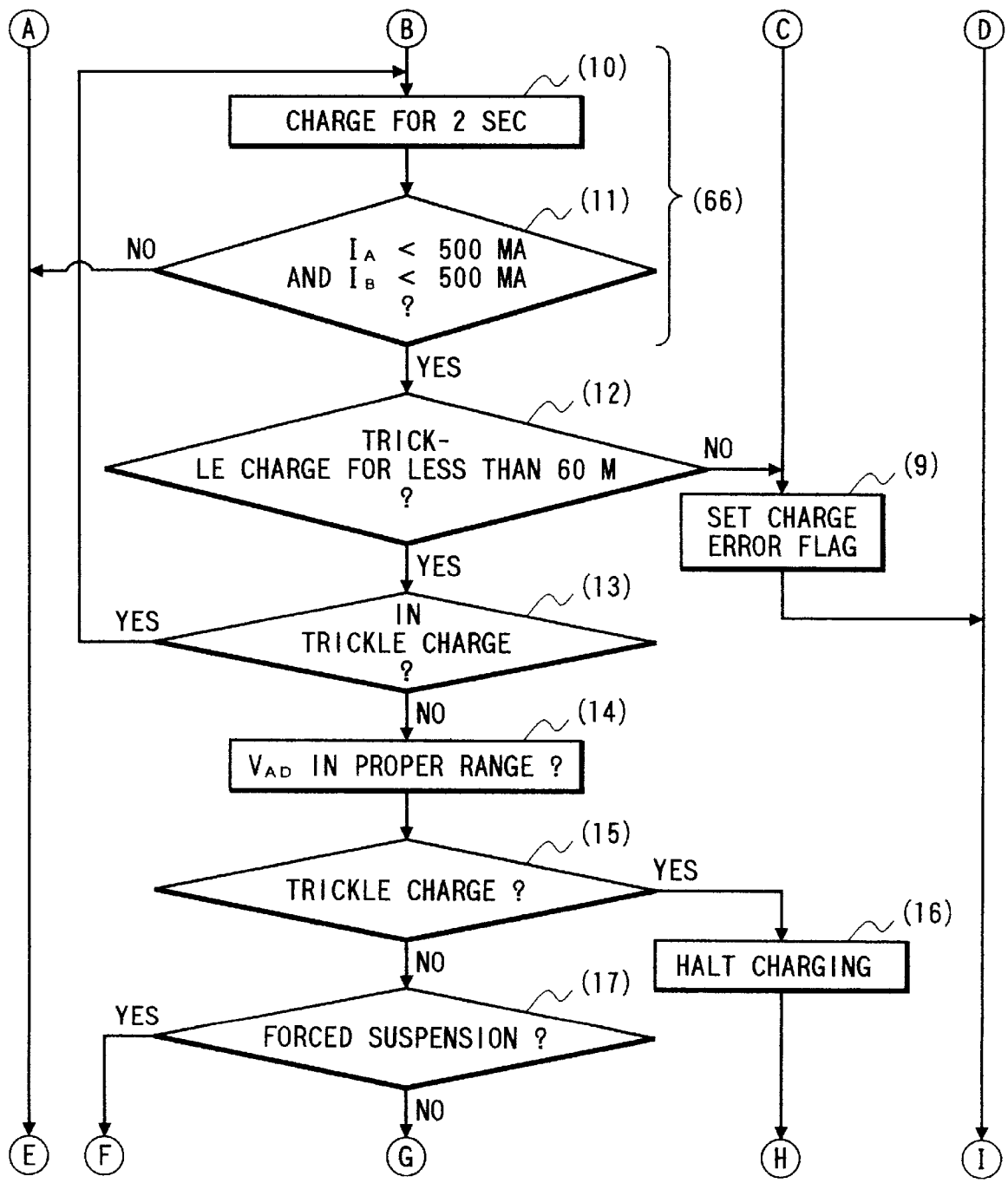
Figure 17B:
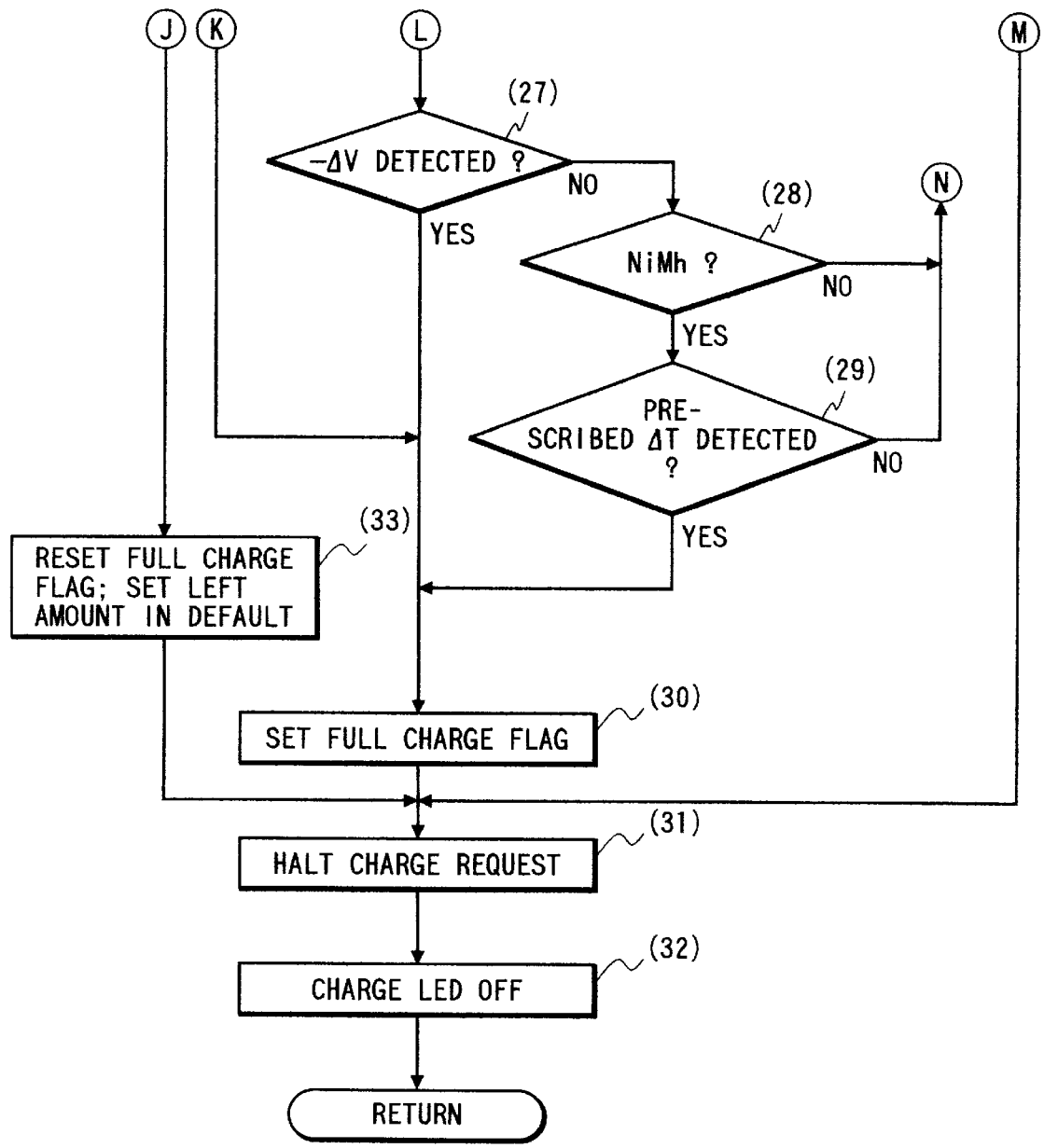
FIG. 17 is comprised of FIGS. 17A and 17B showing flowcharts of the detailed example procedures of the battery charging routine shown in FIG. 8.
Figure 18:
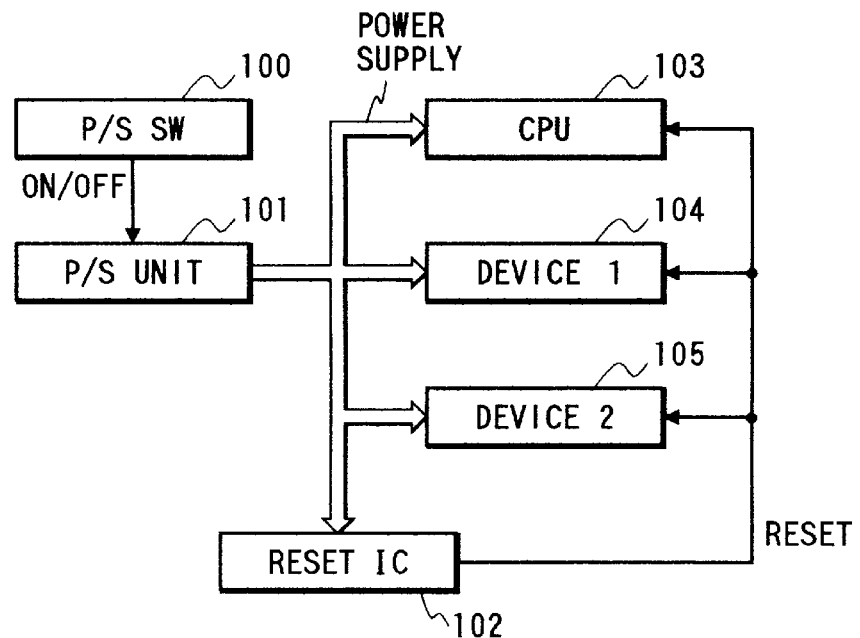
FIG. 18 is a block diagram for explaining the arrangement of a conventional portable information processing apparatus.
Figure 19:
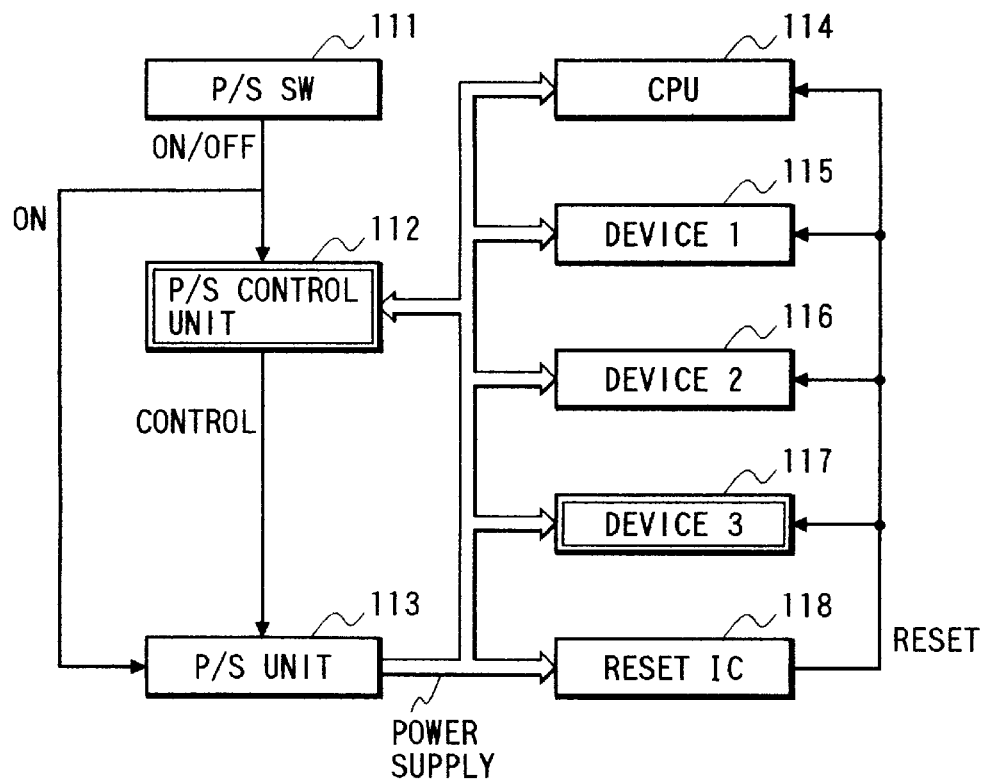
FIG. 19 is a block diagram for explaining the arrangement of another conventional portable information processing apparatus.

In the flowchart in FIG. 15 is shown detailed example procedures of the battery remaining charge level determination routine shown in FIG. 12. It should be noted that numbers (1) though (10) denote individual steps.

The sub-CPU 20 holds one byte in the RAM for storing the remaining battery level. For current remaining battery charge detection, the CPU CPU examines the stored contents and determines a value that is to be referred to from the comparison table that is selected (step (1)). If the AD conversion value Ix, which is acquired by AD conversion of the total current, corresponds to 650 mA and the current remaining battery charge level is high (85% or more), a comparison table for 0.5 A is employed for the current remaining battery charge detection, and the change in a remaining battery charge level is examined by comparing a remaining charge slice voltage, which is between High and U.M., with a battery voltage.

It should be noted that the countermeasure for the noise is employed for a comparison of voltages as well as for the AD conversion of a current value.

First, at step (2), a try counter, which counts the number of comparisons, and an under counter, which counts the number at times that the battery voltage is lower than the slice voltage, are reset. The value held by a try counter is incremented by one, and the comparison of the battery voltage V with the slice voltage Vs is begun by the sense conversion (steps (3) and (4)). When 5 μsec have passed following the start of the sense conversion, the conversion is completed and the comparison result is set in the incorporated I/O RAM of the sub CPU 20. Thus, a check is performed to determine whether or not the battery voltage V is equal to or higher than the slice voltage Vs (step (5)). When the battery voltage V is lower than the slice voltage Vs, the value held by the under counter is incremented (step (7)). At step (8), a check is performed to determine whether or not the value held by the under counter after it was incremented is smaller than "3". If the value is smaller than "3", program control returns to step (3) whereat the comparison by the sense conversion is repeated.

If, at step (8), the value held by the under counter is "3", it is assumed that the remaining battery charge level is changed, and the remaining charge level is reduced by "1" (step (9)). Then, at step (10), a check is performed to determine whether or not the remaining battery charge level is low. When the remaining charge level is not low, program control returns to step (1) and the above described process is repeated. When the battery charge level is low, the remaining battery charge detection process is terminated.

If, at step (5), the battery voltage V is equal to or higher than the slice voltage Vs, a check is performed to determine whether or not the value held by the try counter after it was incremented at step (4) is less than "5" (step (6)). When the value reaches "5" (the comparison is performed five times), it is assumed that there is no change in the remaining battery charge level, and the current level is held. The remaining battery charge detection process is thereafter terminated.

As is described above, in the remaining battery detection process, when the battery voltage is lower than the slice voltage three times or more out of five comparisons, the remaining battery charge level is switched.

(Charging process)

The charging process that is performed in the suspend state and when the AC adaptor is inserted will now be explained while referring to FIGS. 16A, 16B and 17A and 17B.

In the flowcharts in FIGS. 16A, 16B and 17A and 17B are shown detailed example procedures of the battery charging routine in FIG. 8. It should be noted that numbers (1) through (33) denote individual steps.

First, at step (1), a check is performed to determine whether or not both an AC adaptor and a battery pack 10 are present. When charging can not physically be performed because either the AC adaptor or the battery pack 10 is missing, the full charge flag is reset, and a remaining battery charge level becomes the default (step (33)). The charging process is thereafter terminated.

If, at step (1), the charging can be performed, at step (2), a check is performed to determine whether or not the full charge flag is set ("1"). When the decision is YES, program control moves to step (31), and the charging is terminated without performing any further procedures. The full charge flag is set when a full charge is detected through a process which will be described later, and is reset when the AC adaptor is switched to the battery pack to supply power.

AD conversion of the AD terminal input voltage that corresponds to the temperature of the battery pack 10 is performed to determine whether or not the temperature of the battery pack 10 is a chargeable temperature (step (3)). When a nickel-hydrogen battery is employed whose cycle characteristic at high temperature is inferior to that of a nickel-cadmium battery, the temperature is maintained low at 0° C. to 45° C., while the temperature for a nickel cadmium battery is 0° C. through 50° C., so that charging at high temperature is limited.

When, at step (3), the temperature of the battery pack 10 is outside of the above range, the charge LED blinks at an interval of two seconds until the temperature is within the range, and the standby state for charging is displayed (steps (4) and (5)).

When, at step (3), the decision is YES, as is described above in this embodiment, since both a nickel-cadmium battery and a nickel-hydrogen battery are supported and since the processes that are related to the battery (the charging process and the remaining battery charge detection) are distinguished from each other, the battery type is displayed by the charge LED at the beginning of the charging process (step (6)). The charge LED is maintained on for two seconds for a nickel-cadmium battery, and is turned on for one second and turned off for one second for a nickel-hydrogen battery.

During the charging, the AD conversion values of signals that are input from the analog interface are employed to detect a full charge and to detect an error during the charging. When the input signal value becomes abnormal due to the occurrence of a short circuit or of an open circuit, regular charging can not be performed. In this embodiment, there are several means for confirming that these AD input signals are appropriate.

First, at steps (7) and (8), an AD input signal voltage $V_{AD}$ that corresponds to the charge/discharge current of the battery pack is examined in the state immediately before the charging begins, i.e., when power is supplied by the AC adaptor and the charging of the battery pack 10 is not yet being performed. At this time, since neither charging nor discharging is being performed, the design value is 1.85 V. If the AD input signal voltage $V_{AD}$ is outside of the 1.85±0.3 V range while taking into consideration a variance in the accuracy of the electronic devices, it is assumed that the AD input value is abnormal, and a charge error flag is set (step (9)). Program control then moves to step (31) and the charging is thereafter terminated.

If, at step (8), the AD input signal voltage $V_{AD}$ is within the range, a current value that corresponds to a difference from the center value, 1.85 V, is stored, in the incorporated RAM, as a compensation value for calculating a charge current which is performed to check the balance of a charge current, which will be described later.

When, for example, the AD input signal voltage is 1.75 V, its compensation value is +150 mA from the characteristic graph in FIG. 5A.

There are two types of current charges in this embodiment: a rapid charge for a total current of about 2.2 A and a trickle charge for a total current of about 0.1 A. The trickle charge is performed to protect an overly discharged battery whose voltage with no load is less than 9 V. The change from the trickle charge to the rapid charge is performed when the battery voltage is 9 V or higher in the electric circuit of the power supply board. The sub CPU 20 merely controls a charge enable signal, and a current charging mode (trickle charging or rapid charging) is identified by the AD conversion value of a charge current.

Upon receipt of the charge enable signal, charging is performed for two seconds (step (10)), and a charge current is calculated by employing the current AD conversion value of the charge current. Supposing that "It" is a value that is acquired by multiplying the AD conversion value that corresponds to the total current by the compensation value, "Ia" is a value that is acquired by multiplying the AD conversion value that corresponds to a branch current by the compensation value, and "Ib" is a value for the other branch current, Ib=It−Ia.

When Ia<500 mA and Ib<500 mA, the charging mode is determined to be trickle charging (step (11)). When the charging mode is not switched to rapid charging after the trickle charging has continued for 60 minutes (step (12)), it is assumed that there is an error, such as a cell short circuit or an open circuit, in the battery pack. The charging enable signal is halted and the flag is set to indicate a charging error at step (9). The charging process is thereafter terminated.

When the charging is changed from trickle charging to rapid charging (step (13)), a check is performed to determine whether or not the AD input value relating to the current is appropriate, and to determine whether or not the AD input value that corresponds to a battery voltage, which is employed for detecting the full charge, is appropriate (step (14)).

More specifically, the battery voltage rises by several V when the charging is shifted from trickle charging to rapid charging. When the shifting of the charging mode is detected by examining the current (step (15)), the charging is halted for a moment by a charge enable signal, and AD conversion is performed for a voltage at the terminal that corresponds to the battery voltage with no load and in a non charged state (step (16)). Then, it is confirmed that the converted value is within the range that corresponds to 9 V±0.5 V (step (18)).

When the converted value is outside of the range that corresponds to 9 V±0.5 V, there is a problem with the hardware for either the 9 V detector of the power supply unit 23 or for the voltage detection of the sub CPU 20 via the analog interface 24. Thus, it is assumed that the charging is abnormal and the flag is set in the same manner as is described above (step (19)). The charging process is thereafter terminated.

When the beginning of the rapid charging is detected by monitoring a charge current for a cycle of two seconds at steps (10) through (13), the AD conversion value that corresponds to the temperature of the battery pack 10 when the rapid charging is begun is stored in the incorporated RAM, and is used for a compensation process for the detection of a $\Delta T$ full charge in the low temperature environment, which will be described later.

The balance of a charge current during the rapid charging is examined. Charge current values at the right and the left sides of the battery pack are calculated by using the AD conversion values that correspond respectively to the total current and the branch currents, as is described above. When the acquired current values are within the range of from 500 mA to 1500 mA (step (20)), the charging process continues (step (22)).

When, at step (20), the acquired current values are outside of the range, it is probable that a cell short circuit has occurred. The flag is set to indicate the charging is abnormal (step (19)), and the charging process is thereafter terminated.

When a full power down is caused by the above described forced suspension when there is no AC adaptor present and the battery voltage is 9.7 V, the voltages (for 9 cells) on the left and right sides of the battery pack may be unbalanced.

If rapid charging is performed in the unbalanced state, a charge current flows mainly to a lower voltage side for the first several seconds in order to obtain a balance for both sides. Thus, when the forced suspension flag is set (step (17)), the checking of the charge current balance at the above described time is skipped, so that the first check of the balance is performed 30 seconds after the rapid charging is begun.

When, at step (20), the charge current values are within the range, the charging error during the rapid charging and the halting of the charging process due to the detection of a full charge are performed by using battery pack data (battery voltage, battery temperature, total current, and branch current) that are mainly obtained across the analog interface 24. A check is performed at the various above described procedures to determine whether those input signal levels are appropriate. In this embodiment, accumulative time for rapid charging is also managed as an additional protection function. When the total rapid charging time exceeds 90 minutes for a nickel-cadmium battery and 110 minutes for a nickel-hydrogen battery (step (21)), the charging process is terminated.

When, at step (21), the decision is NO, charging for 30 seconds is performed by the charge enable signal if the accumulative time is within the limit. During this time, the I/O sensing is performed for the AC adaptor and the battery pack 10. If a change in the state of the adaptor or the batter pack 10 is detected, the charge enabling signal is canceled and the charging process is terminated.

After the 30-second rapid charging at step (22), the balance of a current charge (step (23)) and an abnormal increase in the battery voltage (whether a current charge is OK) (step (24)) are examined. In this embodiment, when the battery voltage increases to 18 V or higher during the charging, it is assumed to be an abnormal charge and the charging is terminated.

When there is no abnormality found in the balance checking and voltage checking, the detection of the fully charged state is performed.

When the battery is fully charged, the charged energy is converted into thermal energy to generate heat. When it is detected that the temperature T of the battery pack 10 has reached 55° C. by using the AD conversion value that corresponds to the battery temperature, and when the battery voltage is within the upper limit (steps (25) and (26)), it is assumed that the battery pack 10 is fully charged and the charging process is terminated.

When the charging is performed at a high temperature (about 40° C.), the temperature of the battery pack 10 reaches 55° C. several minutes after the fully changed state, and the charging is halted. On the other hand, when the charging is performed at a low temperature (about 5° C.), the charging is continued several tens of minutes even after the battery is fully charged, so that the battery is overcharged. If the overcharging is repeated, the service life of a battery, for which charging and discharging commonly up to 500 cycles is possible, is substantially reduced. This trend is especially remarkable for a nickel-hydrogen battery that generates large heat during rapid charging.

In this embodiment, therefore, in addition to the detection of the full charge at 55° C. for the nickel-hydrogen battery, the increasing rate ($\Delta T$) of the temperature of the battery pack 10 is calculated by monitoring the battery pack over 30 second cycles (step (28)). When an increase in the temperature of 1.5° C. per minute is detected (step (29)), it is assumed that the battery is fully charged and the charging is halted.

The battery voltage that was increasing during the charge is slightly reduced in the fully charged state because of the generation of heat, and reaches a parallel voltage ($-\Delta V$).

The sub CPU 20 then stores a peak value from the battery voltage that it monitors over 30 second cycles. When the peak value that is employed to detect a voltage drop ($-\Delta V$) is 130 mV for a nickel-cadmium battery and by 90 mV for a nickel hydrogen battery (step (27)), the full charge flag is set to indicate the fully charged state (step (30)). A charge request is halted (step (31)), the charge LED is turned off (step (32)), and the charging process is thereafter terminated.

In the remaining battery charge detection process of this embodiment, in addition to normal AD conversion, sense conversion (which will be described in detail later) is provided to compare a value set by the program with the input voltage. For the remaining battery charge detection, four processes are performed: discharge current detection (with noise filtering), table temporary determination by acquiring a proximate value for a discharge current, load change checking, and voltage comparison (with noise filtering).

In the sense conversion process, the removal of noise that occurs during the discharge current detection is characterized by a method (retry) wherein AD conversion and sense conversion by using conversion value±α (noise allowable value) are performed, and the AD conversion is repeated when the result of the sense conversion exceeds the allowable value.

The load change checking is characterized by a method (retry) wherein sense conversion by using AD conversion value±β (load change allowable value), which is acquired by the detection of the discharge current, is performed, and the detection of a discharge current is repeated when the result of sense conversion exceeds the allowable value.

In order to obtain the minimum number of retrials when the result of sense conversion exceeds the allowable values α and β, the optimal allowable values are about half of the maximum rounding error of a discharge current that is obtained with the temporary determination of a table.

The voltage comparison is characterized by performing sense conversion between a table value (a value that corresponds to a remaining charge level switch voltage) and an input voltage (voltage at a terminal corresponding to a battery voltage) a plurality of times (e.g., 5 times) and by switching a remaining battery charge when the input voltage value is lower than the table value a predetermined number of times (e.g., 3 times) or more.

As is described above, since the remaining battery charge detection is performed by software noise filtering and by a protocol with checking the load change while the AD conversion and the sense conversion are employed, the removal of the noise and the countermeasure for the change in a load are balanced, and the remaining battery charge detection can be performed for a short processing time with a comparatively high accuracy.

In this embodiment, there are two cases when a low battery signal is output: in a low suspend state when a constant period of time (30 seconds) has elapsed following the detection of the low level according to the remaining battery charge detection process; and in a forced suspend state when the battery voltage falls to a voltage (9.7 V) that is lower than a low level detection voltage. In the latter case, the forced suspend flag is set before the low battery signal is output.

When the battery is driven from its fully charged state, even if the low level is detected, a charge of 10% still remains, so that the voltage drop for 30 seconds is approximately 0.1 V to 0.2 V, which corresponds to the low suspend state. However, when rapid charging for one minute is performed for a battery after discharge, the voltage of the battery may drop about 1 V in 30 seconds. In this case, the right and left voltages of the battery cells, which are connected in parallel in the battery pack 10, are unbalanced. In the charging process that is performed in the suspend state, when the sub-CPU 20 refers to the forced suspend flag which is found to be set, the first balance check for a charge current is skipped (program control jumps from step (17) to step (20) in FIGS. 16A and 17A for the battery charging process). The first current balance checking (step (24) in FIG. 17A) is performed 30 seconds later.

In the normal use (the repetition of full charge and complete discharge) of the battery pack 10, an error in the battery pack 10 is detected by examining the balance of a charge current immediately after the charging is begun. When the battery pack 10 is used in an unusual manner (e.g., repetition of complete discharge and several-minute charging), the battery pack 10 can be prevented from being mistakenly assumed to be abnormal.

In the above embodiment, a comparison table is selected only from a proximate value of a discharge current. Since a discharge voltage characteristic differs with the battery temperature (low temperature/normal temperature) and the battery type (nickel-cadmium/nickel-hydrogen), tables (e.g., 32 tables of 8 level currents×2 level temperatures×2 battery types) are prepared while taking those factors into consideration, and the accuracy of the remaining battery charge can be increased.

Even for a lithium ion battery, whose discharge current characteristic differs greatly from those of the nickel-cadmium and the nickel-hydrogen batteries, the present invention can be applied as long as tables for it are prepared.

Although, in the embodiment, a single microcomputer is employed for remaining battery charge detection and for charging control, an independent device may perform each processing procedure. For example, when a microcomputer performs only charging control and when the detection of a low level remaining battery charge is performed only by a comparison of a battery voltage and a fixed voltage, a circuit can be simplified more. In this case, the low level detection voltage is 1.1 V/cell, and the forced suspend voltage is about 1.07 V/cell.

Further, in the above embodiment, the time delay from the low level detection until the shifting of the suspend mode (output of a battery low signal) is 30 seconds (step (10) in FIG. 7). To extend the time delay, merely the forced suspend voltage is set lower (lower than 9.7 V). To shorten the time delay, the forced suspend voltage is set higher than 9.7 V.

The arrangement of the battery pack 10 is not limited to the series connection of nine cells and parallel connection of two rows. The present invention can be applied in all cases for checking current balance during the charging of a battery pack with a parallel arrangement.

Although, in this embodiment, an ink-jet printer unit is defined as a unit that requires a retraction process time (OFF delay) when power is off, the present invention can be applied for an FD, an HD, and an MO unit if the logic power supply is in common.

In order to reduce the power consumption in the suspend state, two types of logic DC/DC converters are employed: the main DC/DC converter for the normal operating mode, and the suspend DC/DC converter for the suspend mode. A single DC/DC converter may be employed to simplify the circuit arrangement of the power supply unit and the control of the one chip microcomputer.

Further, a microcomputer that is employed in this embodiment unconditionally begins with the same branch address (the head address of the program) for normal resetting and watchdog resetting. The present invention can, however, be applied for a microcomputer that is programmable by vectors.

The functions of the one chip microcomputer are not limited to key scanning and battery management, and communication control and LCD control may be added.

As is described above, according to the present invention, the first conversion means converts an analog value of a current that is monitored by the analog unit into the first digital current value at each predetermined cycle; the second conversion means converts the first digital current value into the second digital current value that is incremented or decremented by the preset allowable conversion value; the determination means compares the acquired second digital current value with the first digital current value that is acquired by the first conversion means to determine whether or not changes of the first and the second digital values are convergent within an area of the allowable conversion value; and the holding means holds the first digital current value as a discharge current value for the battery when the change in the first digital current value is convergent within an area of the allowable conversion value. In this manner, it is determined quickly whether there is noise influence, which occurs when an analog current value, which indicates the remaining charge on the battery, is converted into a digital current value, so as to enable the detection of a proximate value for a discharge current value, for the battery, from which the noise component is removed.

Further, according to the present invention, when the selection means temporarily selects a level table in consonance with the discharge current value held in the holding means to determine the remaining power level of the secondary battery, and when the change determination means determines that the discharge current value of the secondary battery is convergent in the predetermined allowable change range, the remaining battery charge level determination means compares the battery voltage of the secondary battery pack with the voltage value in the level table, which is selected by the selection means, to determine the remaining battery charge level, so that, regardless of the fluctuation of a load, a remaining battery charge level can be determined quickly and comparatively accurately in consonance with the battery voltage of the secondary battery.

In addition, according to the present invention, when the condition detection means acquires the condition of the battery pack by the analog unit, the remaining battery charge determination means determines the remaining battery charge of the battery pack in consonance with the condition data, and the charging control means begins to charge the battery pack according to the determined remaining battery charge value. At each predetermined period of time that is consonant with the remaining battery charge value, the error detection means examines a current balance between the secondary battery rows of the battery pack to detect a charging error. In this manner, it can be determined whether an unbalanced current to the battery rows of the battery pack is caused by the potential of the battery pack before the charging began, or is caused by the deterioration of the secondary batteries. When an unbalanced current to the battery rows of the battery pack is caused by the potential of the battery pack before the charging is begun, this is not regarded as a charging error and charging can continue to be performed.

Moreover, according to the present invention, the OFF instruction for the instruction means is detected, and the power supply control means controls the time for the halting of the supply of power from the power supply means to the individual units in consonance with the I/O monitoring condition for a predetermined period of time, so that the power can be turned off at such a time following the turning off of the instruction means and that there is no interference with individual units.

Therefore, it is possible to provide an portable information processing apparatus that can detect a remaining battery charge level quickly and comparatively accurately while it eliminates the influence of noise that can be caused when a remaining battery charge is to be detected; that can prevent a battery pack from being mistakenly identified as abnormal by delaying the timing for detecting the unbalanced state of the voltages at each voltage row, which can occur temporarily during the charging of a secondary battery pack when a plurality of cells are connected in series and parallel; that changes power control procedures for each different suspend mode so that it can control with no problem the supply of power to a unit, such as a printer unit, that consumes a large current, even when a remaining battery charge is comparatively low; and that can match the phases of the individual units to ensure rebooting is actually performed when a power supply SW is turned on or off at an arbitrary time.

What is claimed is:

1. A charge control apparatus which charges a plurality of rechargeable batteries connected in parallel by means of an AC adaptor, said apparatus comprising:

detection means for detecting a charge current;

status determination means for determining a status of the batteries on the basis of the charge current detected by said detection means;

charge control means for controlling charge of the batteries on the basis of the status of the batteries determined by said status determination means;

balance determination means for determining a balance among charge currents for the batteries every time period corresponding to the status of the batteries determined by said status determination means; and error determination means for determining a charge error in response to a determination result by said balance determination means.

2. A portable information processing apparatus according to claim 1, further comprising adaptor detection means for detecting an operating state of an AC adaptor, wherein said charging control means temporarily halts a supply of power from said battery pack when said remaining battery charge that is determined by said remaining battery charge determination means is reduced to a value that is set in advance, and wherein, when said adaptor detection means detects that charging from said AC adaptor is begun, charging to said battery pack is started.

3. A portable information processing apparatus according to claim 2, wherein said charging control means performs a first suspend shifting pattern, in which a supply of power from said battery pack is temporarily halted following a specific period of time in a case that said remaining battery charge that is determined by said remaining battery charge determination means falls below a value that is set in advance, and a second suspend shifting pattern, in which a supply of power from said battery pack is temporarily halted immediately in a case that a battery voltage falls below a value that is set in advance.

4. A portable information processing apparatus according to claim 1, further comprising memory means for storing a current suspend pattern when a supply of power from said battery pack is temporarily halted, wherein, at each predetermined period of time that is consonant with a suspend pattern that is stored in said memory means since charging is begun by said charging control means, said error detection means examines a current balance between secondary battery rows of said battery pack to detect a charging error.

5. A portable information processing apparatus having a plurality of units each of which processes data by employing power supplied from a battery pack formed by secondary batteries rechargeable by an AC adaptor, said apparatus comprising:

power supply means for supplying power of a predetermined potential to each of said plurality of units and for halting the power supply to each unit, on the basis of power from the battery pack;

instruction means for providing an instruction for supplying the power from the battery pack and an instruction for halting the power supply from the battery pack; and power source control means for detecting the instruction for halting the power supply provided by said instruction means to control a time at which the power from said power supply means to said plurality of units is halted, in accordance with an I/O monitoring state within a predetermined period.

6. A portable information processing apparatus according to claim 5, wherein said power source control means is a one-chip microcomputer that has a watchdog timer function and a release instruction function for releasing a reset of one of the units.

7. A portable information processing apparatus according to claim 5, wherein said power supply means detects an ON instruction from said instruction means and unconditionally begins to supply a predetermined potential to individual units.

8. A portable information processing apparatus according to claim 6, wherein said one-chip microcomputer detects an OFF instruction of said instruction means and outputs a power supply halt signal to said power supply means, and wherein said one-chip microcomputer performs a watchdog timing function and a reset process when said one-chip microcomputer determines that said power supply means continues to supply power.

9. An information processing apparatus which processes data using power supplied from a battery, said apparatus comprising:

current detection means for detecting a current discharged from the battery every predetermined period;

change detection means for detecting a change of the current detected by said current detection means at intervals of a determined period;

determination means for determining whether the change detected by said change detection means lies within a predetermined range; and control means for obtaining information indicating a remaining power of the battery from the current detected by said current detection means if said determination means determines that the detected change lies within the predetermined range.

10. An apparatus according to claim 9, wherein said current detection means detects the current by converting an analog value of a current flowing through a resistor into a digital value.

11. An apparatus according to claim 9, wherein said control means does not obtain the information indicating the remaining power of the battery if said determination means determines that the detected change is not within the predetermined range.

12. An apparatus according to claim 9, further comprising memory means for storing a plurality of tables, wherein said control means obtains the information indicating the remaining power of the battery by selecting one of the plurality of tables in response to the magnitude of the detected current.

13. An information processing method for use in a portable information processing apparatus having a plurality of units each of which processes data by employing power supplied from a battery pack formed by secondary batteries rechargeable by an AC adaptor, said method comprising the steps of:

supplying power of a predetermined potential to each of the plurality of units and for halting the power supply to each unit, on the basis of power from the battery pack;

providing an instruction for supplying the power from the battery pack and an instruction for halting the power supply from the battery pack; and detecting the instruction for halting the power supply provided in said instruction providing step, to control a time at which the power from said power supply means to said plurality of units is halted, in accordance with an I/O monitoring state within a predetermined period.

14. A method according to claim 13, wherein said detecting step is performed using a one-chip microcomputer that has a watchdog timer function and a release instruction function for releasing a reset of one of the units.

15. A method according to claim 14, wherein said power supplying step is performed using a power supply means, wherein the one-chip microcomputer detects an OFF instruction provided in said instruction providing step and outputs a power supply halt signal to the power supply means, and wherein the one-chip microcomputer performs a watchdog timing function and a reset process when the one-chip microcomputer determines that the power supply means continues to supply power.

16. A method according to claim 13, wherein said step of supplying power further comprises detecting an ON instruction provided in said instruction providing step and unconditionally beginning to supply a predetermined potential to individual units.

17. An information processing method for use in an information processing apparatus which processes data using power supplied from a battery, said method comprising the steps of:

detecting a current discharged from the battery every predetermined period;

detecting a change of the current detected in said current detecting step every determined period;

determining whether the change detected in said change detecting step lies within a predetermined range; and obtaining information indicating a remaining power of the battery from the current detected in said current detecting step if it is determined in said determining step that the detected change lies within the predetermined range.

18. A method according to claim 17, wherein said current detecting step includes detecting the current by converting an analog value of a current flowing through a resistor into a digital value.

19. A method according to claim 17, wherein, in said obtaining step, the information indicating the remaining power of the battery is not obtained if it is determined in said determining step that the detected change is not within the predetermined range.

20. A method according to claim 17, wherein said obtaining step is performed by selecting one of a plurality of tables in response to the magnitude of the detected current.

21. A method for use in a charge control apparatus which charges a plurality of rechargeable batteries connected in parallel by means of an AC adaptor, said method comprising the steps of:

detecting a charge current;

determining a status of the batteries on the basis of the charge current detected in said detecting step;

controlling charge of the batteries on the basis of the status of the batteries determined in said status determining step;

determining a balance among charge currents for the batteries every time period corresponding to the status of the batteries determined in said status determining step; and determining a charge error in response to a determination result obtained in said balance determining step.

22. A method according to claim 21, further comprising the step of detecting an operating state of an AC adaptor, wherein said controlling step is performed in such manner as temporarily to halt a supply of power from the battery pack when the remaining battery charge that is determined is reduced to a value that is set in advance, and wherein, when it is detected that charging from is begun, charging to the battery pack is started.

23. A method according to claim 22, wherein said charge controlling step includes performing a first suspend shifting pattern, in which a supply of power from the battery pack is temporarily halted following a specific period of time in a case where the remaining battery charge that is determined falls below a value that is set in advance, and a second suspend shifting pattern, in which a supply of power from the battery pack is temporarily halted immediately in a case that a battery voltage falls below a value that is set in advance.

24. A method according to claim 21, further comprising the step of storing, in memory means, a current suspend pattern when a supply of power from the battery pack is temporarily halted, wherein, at each predetermined period of time that is consonant with a suspend pattern that is stored in the memory means since charging is begun, a current balance between secondary battery rows of the battery pack is examined to detect a charging error.

* * * * *

UNITED STATES PATENT AND TRADEMARK OFFICE
CERTIFICATE OF CORRECTION

PATENT NO. : 5,811,890  
DATED : Sept. 22,1998  
INVENTOR(S) : Akihiko Hamamoto

Page 1 of 3

It is certified that error appears in the above-identified patent and that said Letters Patent is hereby corrected as shown below:

On the title page, Item [30], insert --[30] Foreign Application Priority Data
Oct. 27. 1994 [JP] Japan ..... 6-263461--.

In the drawings
SHEET 8

Figure 9, "RESUMTION" should read --RESUMPTION--.

COLUMN 2

Line 55, "are" should read --is--.

COLUMN 3

Line 56, "time of" should be deleted.
Line 57, "period." should read --period of time.--.

COLUMN 6

Line 64, "Resume/suspend" should read --resume/suspend--.

COLUMN 7

Line 30, "sub CPU" should read --sub-CPU--.
Line 56, "sub CPU" should read --sub-CPU--.

UNITED STATES PATENT AND TRADEMARK OFFICE
CERTIFICATE OF CORRECTION

PATENT NO. : 5,811,890
DATED : September 22, 1998
INVENTOR(S) : AKIHIKO HAMAMOTO It is certified that error appears in the above-identified patent and that said Letters Patent is hereby corrected as shown below:

COLUMN 8

Line 4, "sub CPU" should read --sub-CPU--.
    Line 29, "sub CPU" should read --sub-CPU--.

COLUMN 9

Line 4, "The battery" should read --¶ The battery--.
    Line 29, "CPU" should read --sub-CPU--.

COLUMN 18

Line 18, "mΛ<Ix, 250 mΛ<Ix<750 mΛ," should read
      --mA<Ix, 250 mA<Ix<750 mA,--.

COLUMN 19

Line 37, "CPU CPU" should read --sub-CPU 20--.
    Line 60, "sub CPU" should read --sub-CPU--.

COLUMN 21

Line 44, "sub CPU" should read --sub-CPU--.

UNITED STATES PATENT AND TRADEMARK OFFICE
CERTIFICATE OF CORRECTION

PATENT NO. : 5,811,890
DATED : September 22, 1998
INVENTOR(S) : AKIHIKO HAMAMOTO It is certified that error appears in the above-identified patent and that said Letters Patent is hereby corrected as shown below:

COLUMN 23

Line 5, "batter" should read --battery--.
   Line 27, "changed" should read --charged--.
   Line 36, "large" should read --high--.
   Line 48, "sub CPU" should read --sub-CPU--.

COLUMN 26

Line 53, "an" should read --a--.

Signed and Sealed this

Twentieth Day of July, 1999

Attest:

Attesting Officer

Q. TODD DICKINSON

Acting Commissioner of Patents and Trademarks